United States Patent
Kakehata

(10) Patent No.: US 8,114,722 B2
(45) Date of Patent: Feb. 14, 2012

(54) MANUFACTURING METHOD OF SEMICONDUCTOR DEVICE

(75) Inventor: Tetsuya Kakehata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 134 days.

(21) Appl. No.: 12/190,059

(22) Filed: Aug. 12, 2008

(65) Prior Publication Data

US 2009/0203176 A1 Aug. 13, 2009

(30) Foreign Application Priority Data

Aug. 24, 2007 (JP) ................................. 2007-217902

(51) Int. Cl.
*H01L 21/84* (2006.01)
(52) U.S. Cl. .. 438/151; 438/154; 438/199; 257/E21.561
(58) Field of Classification Search .................. 438/154, 438/164, 457, 458, 149, 151, 153, 199–200; 257/E21.561
See application file for complete search history.

(56) References Cited

U.S. PATENT DOCUMENTS

| | | | |
|---|---|---|---|
| 5,313,075 A | 5/1994 | Zhang et al. | |
| 5,866,932 A | 2/1999 | Yamazaki et al. | |
| 6,277,718 B1 | 8/2001 | Naganuma et al. | |
| 6,335,231 B1* | 1/2002 | Yamazaki et al. | ............ 438/151 |
| 6,372,609 B1 | 4/2002 | Aga et al. | |
| 6,690,437 B2 | 2/2004 | Yamazaki et al. | |
| 6,717,181 B2 | 4/2004 | Murakami et al. | |
| 6,849,872 B1 | 2/2005 | Yamazaki et al. | |
| 6,979,840 B1 | 12/2005 | Yamazaki et al. | |
| 7,335,573 B2 | 2/2008 | Takayama et al. | |
| 7,408,191 B2 | 8/2008 | Murakami et al. | |
| 2001/0018245 A1 | 8/2001 | Kimizuka | |
| 2003/0228724 A1* | 12/2003 | Koyama | ........................ 438/174 |
| 2004/0188774 A1 | 9/2004 | Takeda et al. | |
| 2005/0077547 A1* | 4/2005 | Jumpertz et al. | ............... 257/213 |

(Continued)

FOREIGN PATENT DOCUMENTS

JP 61-164266 7/1986

(Continued)

OTHER PUBLICATIONS

Mitani. Y et al., "Defect Creations at Si/SiO2 interface and bulk SiO2," 12th Workshop on Gate Stack Technology and Physics, Jan. 1, 2007, pp. 67-72.

(Continued)

*Primary Examiner* — Thanhha Pham
(74) *Attorney, Agent, or Firm* — Nixon Peabody LLP; Jeffrey L. Costellia

(57) ABSTRACT

To suppress generation of dangling bonds, the present invention relates to a method for manufacturing a semiconductor device including the steps of: forming a semiconductor film; forming a gate insulating film and a gate electrode over the semiconductor film; forming an impurity region in the semiconductor film by addition of an impurity element having one conductivity type thereto; forming an insulating film containing fluorine with the semiconductor film, the gate insulating film, and the gate electrode covered therewith; heating the semiconductor film and the insulating film containing fluorine; and forming a wiring, which is electrically connected to the impurity region, over the insulating film containing fluorine. The insulating film containing fluorine is any one of a silicon oxide film containing fluorine, a silicon oxide film containing fluorine and nitrogen, or a silicon nitride film containing fluorine.

17 Claims, 15 Drawing Sheets

U.S. PATENT DOCUMENTS

2008/0251792 A1 10/2008 Murakami et al.

FOREIGN PATENT DOCUMENTS

| | | |
|---|---|---|
| JP | 61-164286 | 7/1986 |
| JP | 63-237456 | 10/1988 |
| JP | 08-083917 | 3/1996 |
| JP | 2002-064096 | 2/2002 |
| JP | 2004-158603 | 6/2004 |
| JP | 2006-173439 | 6/2006 |
| JP | 2007-053392 | 3/2007 |

OTHER PUBLICATIONS

Hara. H., '3.2.5 Low Dielectric Constant insulating Film' ,ULSI process technology (Advanced Electronics 1-17), Jun. 1997, pp. 84-89.

Jeng, et al., "Anomalous Diffusion of Fluorine in Silicon", Appl. Phys Letters, vol. 61, No, 11, Sep. 14, 1992, pp. 1310-1312.

* cited by examiner

MANUFACTURING METHOD OF SEMICONDUCTOR DEVICE

BACKGROUND OF THE INVENTION

1. Field of the Invention

The present invention relates to a manufacturing method of a semiconductor device having a thin film transistor (TFT) formed using a semiconductor film.

2. Description of the Related Art

In recent years, a TFT has been formed using a semiconductor film (a thickness of approximately several to several hundreds of nanometers) which is formed over a substrate having an insulating surface.

A silicon film can be given as an example of a semiconductor film which serves as an active layer. A silicon dangling bond exists in a silicon film, which has neither bonding between silicon atoms (Si—Si bonding) nor bonding between a silicon atom and an oxygen atom in an oxide film which is disposed close to the active layer (Si—O bonding). Since a dangling bond functions as an interface state which traps and releases electric charges, there is a concern that reliability of a TFT and a semiconductor device might be adversely affected (see Patent Document 1: Japanese Published Patent Application No. 2006-173439).

The semiconductor film is covered with an insulating film containing hydrogen and heat treatment is performed, whereby the dangling bonds in the semiconductor film are terminated (see Non-Patent Document 1: Yuichiro Mitani et at, *Extended Abstracts of the 12$^{th}$ Workshop on Gate Stack Technology and Physics*, pp. 67-72 (2007)).

SUMMARY OF THE INVENTION

With a method for reducing defects in a semiconductor film by termination of dangling bonds by hydrogen, bonding between silicon and hydrogen (Si—H bonding) is separated when electrical and thermal stress is applied to a semiconductor film, for example, when a voltage is continuously applied to a gate electrode in a gate insulating film, or when a current continuously flows through a channel formation region in an active layer which is formed of a polycrystalline silicon film or the like. Accordingly, dangling bonds of silicon are generated, which reduce characteristic of a transistor, for example, a threshold value $V_{th}$, mobility, a subthreshold value, and the like.

In terminating dangling bonds with hydrogen, only a low temperature of approximately 350° C. can be applied to a semiconductor film because a hydrogen atom is desorbed from a silicon film when the semiconductor film is processed at a high temperature of greater than or equal to 550° C.

Therefore, in a subsequent step of adding an impurity element to the semiconductor film, the semiconductor film has to be heated at a high temperature of greater than or equal to 550° C. to activate the added impurity element; however, a temperature for terminating dangling bonds with hydrogen is as low as approximately 350° C. Thus, it is necessary to first perform high-temperature treatment for activating the impurity element and then to perform low-temperature treatment of terminating dangling bonds.

Objects of the present invention are to suppress generation of dangling bonds and to suppress reduction in characteristics of a transistor, such as a threshold value $V_{th}$, mobility, and a subthreshold value.

In the present invention, dangling bonds in a semiconductor film are terminated not with hydrogen but with fluorine. When a silicon film is used as the semiconductor film, bonding between silicon and fluorine (Si—F bonding) has high resistance to stress as compared to bonding between silicon and hydrogen (Si—H bonding).

In the present invention, a film containing fluorine is used to terminate the dangling bonds in the semiconductor film. Specifically, as an interlayer insulating film formed over the semiconductor film, an insulating film containing fluorine is formed.

Accordingly, fluorine atoms in the interlayer insulating film and the dangling bonds in the semiconductor film are bonded to each other; therefore, the dangling bonds are terminated.

In terminating the dangling bonds with fluorine, the terminated fluorine atoms are not desorbed even when the semiconductor film and the interlayer insulating film are processed at a high temperature of greater than or equal to 550° C.; therefore, heat treatment at a temperature of greater than or equal to 550° C. can be performed also for activating an impurity element.

The present invention relates to a method for manufacturing a semiconductor device including the steps of: forming a semiconductor film; forming a gate insulating film over the semiconductor film; forming a gate electrode over the gate insulating film; forming an impurity region in the semiconductor film by addition of an impurity element having one conductivity type to the semiconductor film; forming an insulating film containing fluorine so as to cover the semiconductor film, the gate insulating film, and the gate electrode; heating the semiconductor film and the insulating film containing fluorine so that the impurity element in the impurity region is activated and a dangling bond in the semiconductor film is terminated with fluorine; and forming a wiring, which is electrically connected to the impurity region, over the insulating film containing fluorine after heating the insulating film containing fluorine.

In the present invention, the insulating film containing fluorine is any one of a silicon oxide film containing fluorine, a silicon oxide film containing fluorine and nitrogen, or a silicon nitride film containing fluorine.

In the present invention, the insulating film containing fluorine is heated at a temperature of greater than or equal to 550° C.

In the present invention, the impurity element having one conductivity type is added to the semiconductor film, so that the impurity region in the semiconductor film is made amorphous, and the semiconductor film and the insulating film containing fluorine are heated, so that crystallinity of the impurity region which is made amorphous is recovered.

In the present invention, a step of activating an impurity element and heat treatment for terminating dangling bonds can be performed together at one time; thus, the number of manufacturing steps can be reduced and further the manufacturing cost can be reduced.

When a semiconductor film of a transistor is activated at a temperature of greater than or equal to 550° C., the semiconductor film does not deteriorate easily with respect to stress; thus, a transistor which has high resistance to electrical and thermal stress can be formed.

Further, fluorine for termination is contained in the interlayer insulating film, which can have a low dielectric constant with the use of a film containing fluorine.

Since a source region and a drain region of a transistor are made amorphous after an impurity element is introduced, fluorine is easily diffused into the source region and the drain region when activation of the impurity element and termination of the dangling bonds are performed simultaneously.

Therefore, the dangling bonds in the channel formation region can be compensated more effectively.

DETAILED DESCRIPTION OF THE INVENTION

Figure 1A:
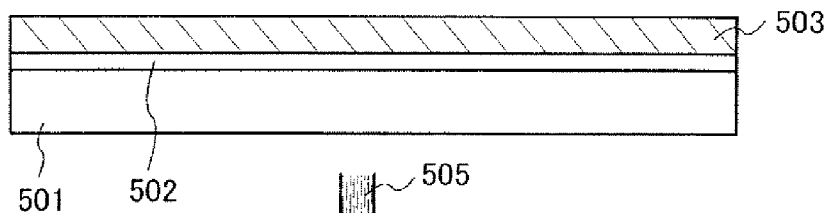
FIGS. 1A to 1G are cross-sectional views showing a manufacturing process of a semiconductor device of the present invention.
Figure 1B:
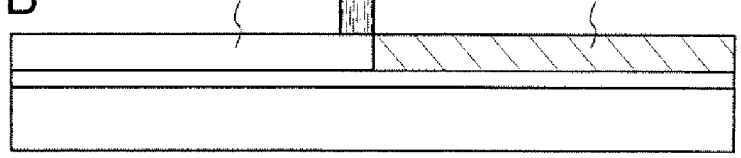

Hereinafter, embodiment modes of the present invention will be described with reference to the drawings. However, the present invention can be implemented in various modes, and it is easily understood by those skilled in the art that modes and details thereof can be modified in various ways without departing from the spirit and the scope of the present invention. Therefore, the present invention should not be interpreted as being limited to the description of the embodiment modes below Note that the same Portions or portions having similar functions in the drawings below are denoted by the same reference numerals and repetitive description thereof will be omitted.

Embodiment Mode 1

This embodiment mode will be described with reference to FIGS. 1A to 1G.

First, a base insulating film 502 and an amorphous semiconductor film 503 (for example, an amorphous silicon film) are formed over a substrate 501 (see FIG. 1A).

The substrate 501 refers to a substrate having an insulating property or a substrate having an insulating surface. A glass substrate (also referred to as a "non-alkali glass substrate") that is used in the electronics industry, such as an aluminosilicate glass substrate, an aluminoborosilicate glass substrate, and a barium borosilicate glass substrate, is used. Alternatively, a quartz substrate, a ceramic substrate, a metal substrate having a surface covered with an insulating film, or the like may be used.

The base insulating film 502 can be formed using a single film or a plurality of stacked films selected from a silicon oxide film, a silicon oxide film containing nitrogen, or a silicon nitride film containing oxygen.

The amorphous semiconductor film 503 may be a semiconductor film containing silicon or a semiconductor film containing germanium.

A semi-amorphous semiconductor film may be used as an alternative to the amorphous semiconductor film 503.

Note that a semi-amorphous semiconductor film refers to a film containing a semiconductor with an intermediate structure between an amorphous semiconductor and a crystalline semiconductor (including a single-crystal semiconductor and a polycrystalline semiconductor). The semi-amorphous semiconductor film is a semiconductor film having a third state that is stable in terms of free energy and is a crystalline substance having a short-range order and lattice distortion which can be dispersed with its grain diameter of 0.5 nm to 20 nm in a non-single-crystal semiconductor film.

In this specification, such a semiconductor film is referred to as a semi-amorphous semiconductor (SAS) film for convenience. Moreover, a rare gas element such as helium, argon, krypton, or neon may be contained therein to further promote lattice distortion, so that stability is enhanced and a favorable semi-amorphous semiconductor film can be obtained. Note that a microcrystalline semiconductor film is also included in the semi-amorphous semiconductor film.

As a semi-amorphous semiconductor film, for example, a semi-amorphous silicon film can be given. A Raman spectrum of the semi-amorphous silicon film is shifted to a lower wavenumber than 520 cm$^{-1}$. The diffraction peaks of (111) and (220) which are to be derived from a silicon (Si) crystalline lattice are observed by X-ray diffraction.

In addition, a semi-amorphous silicon film can be obtained by glow discharge decomposition of a gas containing silicon. As a typical gas containing silicon, $SiH_4$ is given, and $Si_2H_6$, $SiH_2Cl_2$, $SiHCl_3$, $SiCl_4$, $SiF_4$, or the like can be used as well as $SiH_4$. The gas containing silicon is diluted with hydrogen or with a gas in which one or more of rare gas elements selected from helium, argon, krypton, or neon are added to hydrogen; therefore, the semi-amorphous silicon film can be easily formed. It is preferable that the gas containing silicon be diluted with a dilution ratio in the range of from 2 times to 1000 times. Further, a carbide gas such as $CH_4$ or $C_2H_6$, a germanium gas such as $GeH_4$ or $GeF_4$, $F_2$, or the like may be mixed into the gas containing silicon so as to adjust the energy bandwidth within the range of from 1.5 eV to 2.4 eV or from 0.9 eV to 1.1 eV.

After the amorphous semiconductor film 503 is formed, dehydrogenation heat treatment is performed and then crystallization is performed. The crystallization is performed by laser irradiation. When the amorphous semiconductor film 503 is irradiated with a laser beam 505, the irradiated region becomes a crystalline semiconductor film 504 (see FIG. 1B).

When laser irradiation is used, a continuous wave laser beam (a CW laser beam) or a pulsed laser beam (a pulse laser beam) can be used. As a laser beam which can be used here, a laser emitted from one or more of the following can be used: a gas laser such as an Ar laser, a Kr laser, or an excimer laser; a laser of which medium is single crystalline of YAG, YVO$_4$, forsterite (Mg$_2$SiO$_4$), YAlO$_3$, or GdVO$_4$, or polycrystalline (ceramic) of YAG, Y$_2$O$_3$, YVO$_4$, YAlO$_3$, or GdVO$_4$, added with one or more of Nd, Yb, Cr, Ti, Ho, Er, Tm, and Ta as a dopant; a glass laser; a ruby laser; an alexandrite laser; a Ti:sapphire laser; a copper vapor laser; or a gold vapor laser. Crystals with a large grain size can be obtained by irradiation with a fundamental wave or one of second to fourth harmonics of the fundamental wave of such a laser beam. For example, the second harmonic (532 nm) or the third harmonic (355 nm) of an Nd:YVO$_4$ laser (fundamental wave of 1064 nm) can be used. In this case, a power density of the laser is needed to be approximately 0.01 MW/cm$^2$ to 100 MW/cm$^2$ (preferably 0.1 MW/cm$^2$ to 10 MW/cm$^2$). Irradiation is performed with a scanning speed of approximately 10 cm/sec to 2000 cm/sec.

Note that a laser of which medium is single crystalline of YAG, YVO$_4$, forsterite (Mg$_2$SiO$_4$), YAlO$_3$, or GdVO$_4$, or polycrystalline (ceramic) of YAG, Y$_2$O$_3$, YVO$_4$, YAlO$_3$, or GdVO$_4$ added with one or more of Nd, Yb, Cr, Ti, Ho, Er, Tm, and Ta as a dopant; an Ar ion laser; or a Ti:sapphire laser can be continuously oscillated, and pulse oscillation thereof can be performed at a repetition rate of greater than or equal to 10 MHz by performing Q-switch operation, mode locking, or the like. When a laser beam is oscillated at a repetition rate of greater than or equal to 10 MHz, a semiconductor film is irradiated with the next pulse while the semiconductor film is melted by the laser and solidified. Therefore, unlike the case of using a pulsed laser with a low repetition rate, a solid-liquid interface can be continuously moved in the semiconductor film; thus, crystal grains which continuously grow in a scanning direction can be obtained.

When ceramic (polycrystal) is used as a medium, the medium can be formed to have a desired shape for a short time and at low cost. When a single crystal is used, a columnar medium with several millimeters in diameter and several tens of millimeters in length is usually used. When the ceramic is used, a medium larger than the case of using the single crystal can be formed.

A concentration of a dopant such as Nd or Yb in a medium, which directly contributes to light emission, cannot be changed largely in either case of the single crystal or the polycrystal; thus, there is some limitation on improvement in output of a laser by increase in the concentration of the dopant. However, in the case of ceramic, the size of the medium can be significantly increased as compared to the case of the single crystal; thus, drastic improvement in output of a laser can be realized.

In addition, in the case of ceramic, a medium with a parallelepiped shape or a rectangular parallelepiped shape can be easily formed. When a medium having such a shape is used and oscillated light is made travel in a zigzag manner inside the medium, a path of the oscillated light can be made long. Therefore, amplification is increased, and a laser beam can be oscillated at high output. Further, since a cross section of a laser beam emitted from the medium having such a shape has a quadrangular shape, it has an advantage over a circular beam of being shaped into a linear beam. By shaping a laser beam emitted in such a manner by using an optical system, a linear beam having a length of less than or equal to 1 mm on a lateral side and a length of several millimeters to several meters on a longitudinal side can be easily obtained. Furthermore, when such a medium is uniformly irradiated with excited light, energy distribution of a linear beam becomes uniform in a longitudinal direction.

The amorphous semiconductor film 503 is irradiated with the linear laser beam 505, so that the entire surface of the amorphous semiconductor film 503 can be annealed more uniformly. When uniform annealing is needed from one end to the other end of the linear beam, ingenuity such as arrangement in which slits are provided in both ends of the linear beam to shield light at a portion where energy is attenuated is necessary.

Here, if necessary, an impurity element imparting p-type conductivity, for example, boron may be added to the obtained crystalline semiconductor film 504 in order to control a threshold value of a semiconductor device.

Figure 1C:
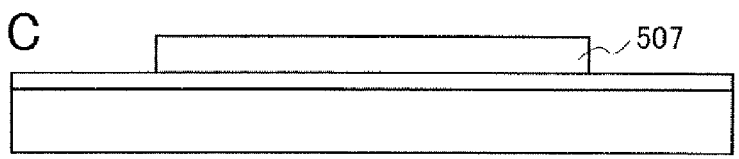

Next, the crystalline semiconductor film 504 is etched by dry etching to form an island-like semiconductor film 507 (see FIG. 1C).

Then, a gate insulating film 508 is formed to cover the island-like semiconductor film 507. The gate insulating film 508 may be any one of a silicon oxide film, a silicon nitride film, a silicon oxide film containing nitrogen, or a silicon nitride film containing oxygen, or a stacked film thereof.

Figure 1D:
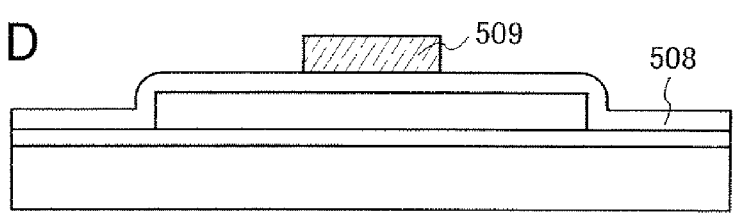

A gate electrode 509 is formed over the gate insulating film 508 (see FIG. 1D). As a material of the gate electrode 509, any one of aluminum (Al), tantalum (Ta), titanium (Ti), molybdenum (Mo), tungsten (W), neodymium (Nd), chromium (Cr), nickel (Ni), platinum (Pt), gold (Au), silver (Ag), or copper (Cu); a stacked layer of a plurality of films; or an alloy of a plurality of materials can be used.

Figure 1E:
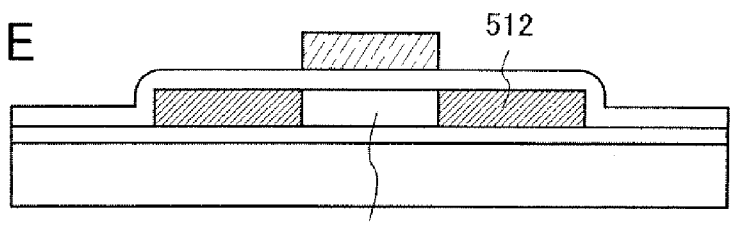

Next, an impurity element imparting one conductivity type is introduced into the island-like semiconductor film 507 with the gate electrode 509 as a mask to form a channel formation region 511 and high-concentration impurity regions 512 which are a source region and a drain region (see FIG. 1E). In addition, a low-concentration impurity region may be formed between the channel formation region 511 and each of the high-concentration impurity regions 512 by forming a mask or a sidewall or by forming the gate electrode 509 with a two-layer structure.

For an impurity element imparting one conductivity type, phosphorus (P), arsenic (As), or the like may be used as an n-type impurity element. In addition, boron (B) may be used as a p-type impurity element. Note that the polarity of the channel formation region 511 is opposite to the polarity of the high-concentration impurity regions 512 when the impurity element imparting p-type conductivity, for example, boron (B) is added to the crystalline semiconductor film 504 the n-type impurity element is used as the impurity element imparting one conductivity type.

When the impurity element imparting one conductivity type is introduced into the island-like semiconductor film 507, crystallinity of the introduced regions, that is, the high-concentration impurity regions 512 is damaged and the high-concentration impurity regions 512 made amorphous. Thus, a heating step is necessary to recover the crystallinity.

Figure 1F:
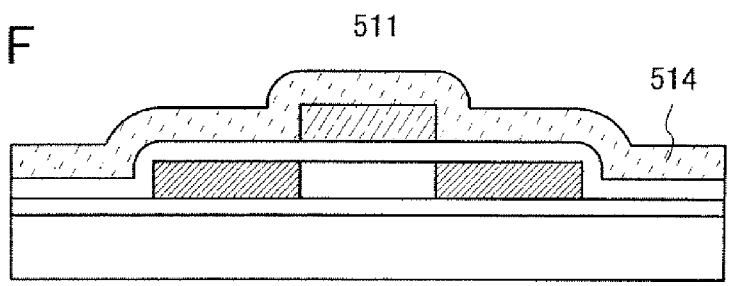

Next, an interlayer insulating film 514 is formed to cover the island-like semiconductor film 507, the gate insulating film 508, and the gate electrode 509 (see FIG. 1F). The interlayer insulating film 514 is formed of a single layer or a stacked layer of an insulating film containing fluorine. As the insulating film containing fluorine, a silicon oxide film containing fluorine (referred to as "SIOF" in this specification), a silicon oxide film containing fluorine and nitrogen (referred to as "SiONF" in this specification), a silicon nitride film containing fluorine (referred to as "SiNF" in this specification), and the like can be given.

When the interlayer insulating film 514 is formed of the insulating film containing fluorine, a dielectric constant can be reduced. As a concentration of fluorine in an insulating film containing fluorine is increased, a dielectric constant of the insulating film containing fluorine tends to decrease. Therefore, it is preferable that a concentration of fluorine in the insulating film containing fluorine in the present invention is greater then or equal to 5 atomic %. However, hygroscopicity of an insulating film containing fluorine increases even when a concentration of fluorine in the insulating film containing fluorine is increased. The hygroscopicity of the insulating film containing fluorine varies depending on a film formation method. In a case where the insulating film containing fluorine is formed by a plasma CVD method using dense plasma, it is possible to suppress the hygroscopicity of the insulating film containing fluorine when a concentration of fluorine of the insulating film containing fluorine is increased. Therefore, for example, it is preferable to form the insulating film containing fluorine of the present invention in such a way that the concentration of the insulating film containing fluorine is greater than or equal to 5 atomic % and less than or equal to 10 atomic %.

The dielectric constant of a silicon oxide film which does not contain fluorine is 3.8 to 4.0. On the other hand, the dielectric constant of the silicon oxide film containing fluorine (SiOF) is 3.4 to 3.6, and a dielectric constant is reduced when fluorine is contained.

After the interlayer insulating film 514 is formed, heating at a temperature of greater than or equal to 550° C., specifically heating at 550° C. for 4 hours is performed thereon. When a glass substrate is used as the substrate 501, heating is performed thereon at a temperature of greater than or equal to 550° C. and less than or equal to a glass strain point. Through the heating step, fluorine contained in the interlayer insulating film 514 terminates dangling bonds in the island-like semiconductor film 507, and at the same time, the added impurity element imparting one conductivity type is activated, and the crystallinity of the high-concentration impurity regions 512 to which the impurity element is added is recovered. In other words, the step of terminating the dangling bonds and the step of activating the impurity element can be performed simultaneously.

In addition, the high-concentration impurity regions 512 are made amorphous because of addition of the impurity element; therefore, fluorine atoms easily diffuse into the high-concentration impurity regions 512 from the interlayer insulating film 514. Consequently, the dangling bonds in the channel forming region 511 can be terminated more effectively.

Annealing for terminating the dangling bonds in the island-like semiconductor film 507 is performed at a higher temperature than the conventional case, so that a TFT does not deteriorate easily with respect to stress; thus, stabilization of the TFT can be achieved.

Figure 1G:
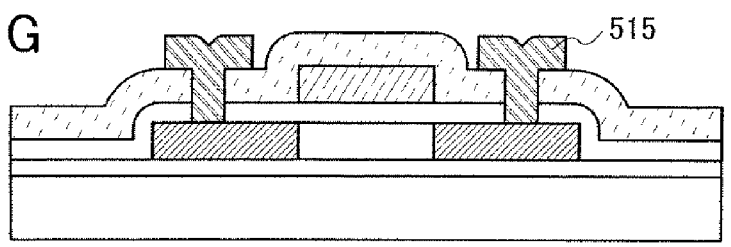

Next, wirings 515 are formed over the interlayer insulating film 514 (see FIG. 1G). The wiring 515 is electrically connected to the high-concentration impurity region 512 through a contact hole in the interlayer insulating film 514. Through the above steps, a semiconductor device of this embodiment mode is manufactured.

In the present invention, the step of activating an impurity element and heat treatment for terminating dangling bonds can be performed together at one time; thus, the number of manufacturing steps of a semiconductor device can be reduced and further the manufacturing cost can be reduced. In addition, a semiconductor device which has high resistance to electrical and thermal stress can be obtained.

Embodiment Mode 2

In this embodiment mode, the island-like semiconductor film 507 which is described in Embodiment Mode 1 will be described using an SOI substrate.

Substrates having an SOI structure related to this embodiment mode and manufacturing methods thereof will be described with reference to FIGS. 2A and 2B, FIGS. 3A to 3C, FIGS. 4A to 4C, FIGS. 5A and 5B, FIGS. 6A to 6C, FIGS. 7A to 7C, FIGS. 8A and 8B, and FIGS. 9A to 9C.

First, a structure of a substrate having an SOI structure is described with reference to FIGS. 2A and 2B, and FIGS. 3A to 3C.

Figure 2A:
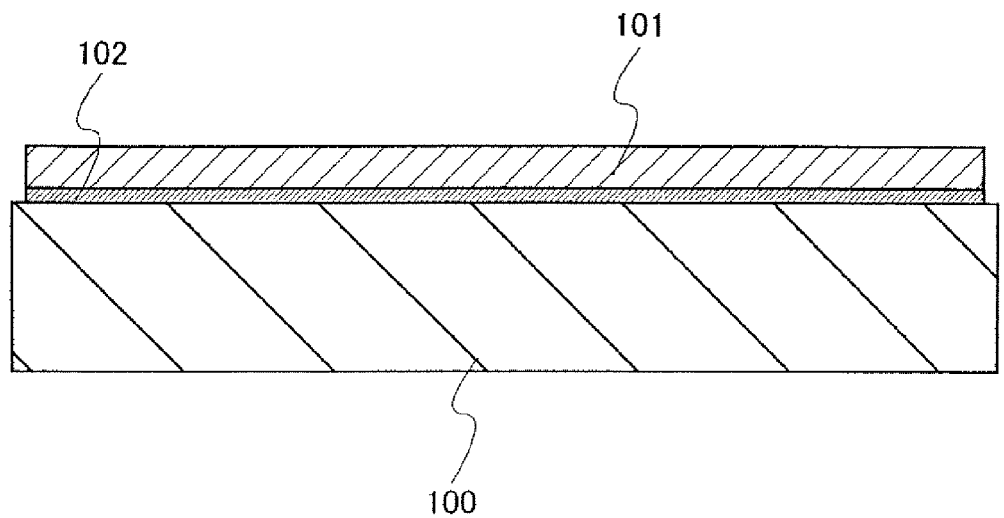
FIGS. 2A and 2B are cross-sectional views each showing a manufacturing process of a semiconductor device of the present invention.

In FIG. 2A, a supporting substrate 100 refers to a substrate having an insulating property or a substrate having an insulating surface. A glass substrate (also referred to as a "non-alkali glass substrate") that is used in the electronics industry, such as aluminosilicate glass substrate, aluminoborosilicate glass substrate, and barium borosilicate glass substrate, is used.

In other words, a glass substrate that has a thermal expansion coefficient of $25 \times 10^{-7}/°$ C. to $50 \times 10^{-7}/°$ C. (preferably $30 \times 10^{-7}/°$ C. to $40 \times 10^{-7}/°$ C.) and a strain point of 580° C. to 680° C. (preferably 600° C. to 680° C.) can be used as the supporting substrate 100. Alternatively, a quartz substrate, a ceramic substrate, a metal substrate having a surface covered with an insulating film, or the like can be used.

A low-temperature single-crystal semiconductor (LTSS) layer 101 is a single-crystal semiconductor layer, and single-crystal silicon is typically used.

Alternatively, as the LTSS layer 101, a crystalline semiconductor layer of silicon, germanium, or a compound semiconductor such as gallium arsenide or indium phosphide, which can be separated from a single-crystal semiconductor substrate or a polycrystalline semiconductor substrate as by a hydrogen ion implantation separation method, can be used.

Between the supporting substrate 100 and the LTSS layer 101, a bonding layer 102 which has a smooth surface and forms a hydrophilic surface is provided. The bonding layer 102 is a layer which has a smooth surface and a hydrophilic surface. As a layer which can form such a surface, an insulating layer formed by a chemical reaction is preferable. For example, an oxide semiconductor film formed by a thermal or chemical reaction is suitable. The main reason is that a film formed by a chemical reaction can ensure its surface smoothness.

The bonding layer 102 which has a smooth surface and forms a hydrophilic surface is provided with a thickness of 0.2 nm to 500 nm. With this thickness, it is possible to smooth surface roughness of a surface on which a film is to be formed and also to ensure smoothness of a growth surface of the film.

When the LTSS layer 101 is formed of silicon, the bonding layer 102 can be formed using silicon oxide which is formed by heat treatment in an oxidizing atmosphere, silicon oxide which grows by reaction of oxygen radicals, a chemical oxide which is formed with an oxidizing chemical solution, or the like.

When a chemical oxide is used for the bonding layer 102, the bonding layer 102 may have a thickness of 0.1 nm to 1 nm. Preferably, the bonding layer 102 is formed of silicon oxide which is deposited by a chemical vapor deposition method. In this case, silicon oxide formed by a chemical vapor deposition method using an organic silane gas is preferable.

Examples of organic silane gases which can be used include compounds containing silicon such as tetraethoxysilane (TEOS) (chemical formula: $Si(oc_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

The bonding layer 102 is provided on the LTSS layer 101 side and disposed in close contact with the surface of the supporting substrate 100, whereby a bond can be formed even at a room temperature. In order to form a stronger bond, the supporting substrate 100 and the LTSS layer 101 may be pressed against each other In bonding the supporting substrate 100 and the bonding layer 102 which are of different kinds of materials, the surfaces are cleaned. When the cleaned surface of the supporting substrate 100 and that of the bonding layer 102 are disposed in close contact with each other, a bond is formed by an attracting force between the surfaces.

It is more preferable for formation of a bond that the surface of the supporting substrate 100 be subjected to treatment for attaching a plurality of hydrophilic groups to the surface. For example, it is preferable that the surface of the supporting substrate 100 be subjected to oxygen plasma treatment or ozone treatment so that the surface becomes hydrophilic.

When the surface of the supporting substrate 100 is subjected to treatment for making the surface hydrophilic, hydroxyl groups on the surface act and a bond by hydrogen bonding is formed. Furthermore, when heating is performed at a temperature of greater than or equal to a room temperature on the supporting substrate 100 and the LTSS layer 101, the bond of which is formed by disposing cleaned surfaces in close contact with each other, bonding strength can be increased.

As treatment for bonding of the supporting substrate 100 and the bonding layer 102 which are of different kinds of materials, surfaces which are to form a bond may be cleaned by being irradiated with an ion beam obtained from an inert gas such as argon. By irradiation with the ion beam, dangling bonds are exposed on the surface of the supporting substrate 100 or the bonding layer 102, and an extremely active surface is formed.

If such activated surfaces are disposed in close contact with each other, a bond between the supporting substrate 100 and the bonding layer 102 can be formed even at a low temperature. A method of forming a bond after surface activation is preferably performed in vacuum because the surface needs to have a high degree of cleanness.

The LTSS layer 101 is formed by slicing of a crystalline semiconductor substrate. For example, when a single-crystal silicon substrate is used as the single-crystal semiconductor substrate, the LTSS layer 101 can be formed by an ion implantation separation method in which ions of hydrogen or fluorine are implanted into a predetermined depth of the single-crystal silicon substrate and then heat treatment is performed to separate a single-crystal silicon layer which is a surface layer. Alternatively, a method may be employed in which single-crystal silicon is epitaxially grown on porous silicon and then a porous silicon layer is separated by cleavage with water jetting. The thickness of the LTSS layer 101 is 5 nm to 500 nm, preferably 10 nm to 200 nm.

Figure 2B:
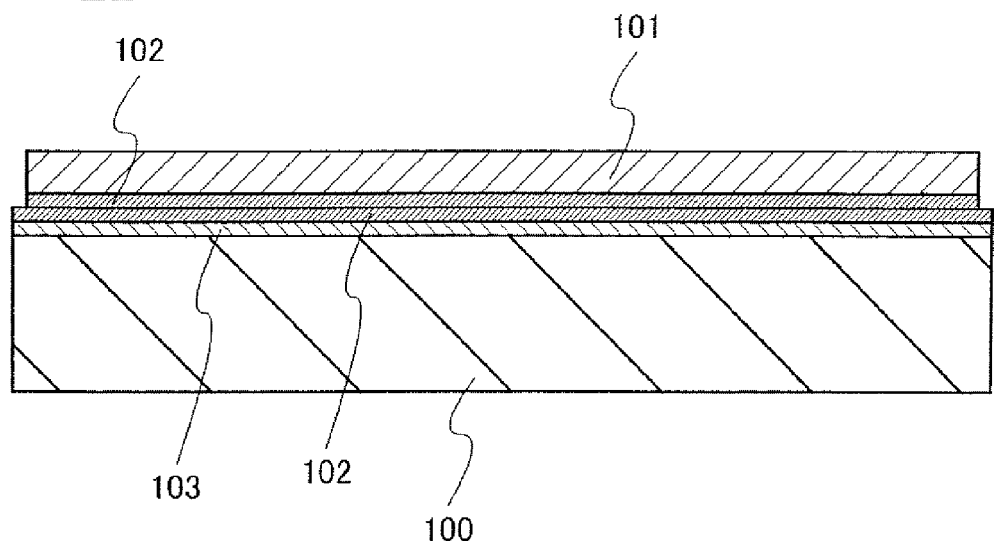

FIG. 2B shows a structure in which the supporting substrate 100 is provided with a barrier layer 103 and the bonding layer 102. By provision of the barrier layer 103, the LTSS layer 101 can be prevented from being contaminated by a mobile ion impurity like alkali metal or alkaline earth metal that is diffused from a glass substrate which is used as the supporting substrate 100. The bonding layer 102 is preferably provided over the barrier layer 103.

By provision of the barrier layer 103 which prevents impurity diffusion and the bonding layer 102 which ensures bonding strength, that is, a plurality of layers with different functions over the supporting substrate 100, the range of choices of the supporting substrate can be expanded. It is preferable that the bonding layer 102 be provided also on the LTSS layer 101 side. In other words, in bonding the LTSS layer 101 to the supporting substrate 100, it is preferable that one of or both of surfaces that are to form a bond be provided with the bonding layer 102, so that bonding strength can be increased.

Figure 3A:
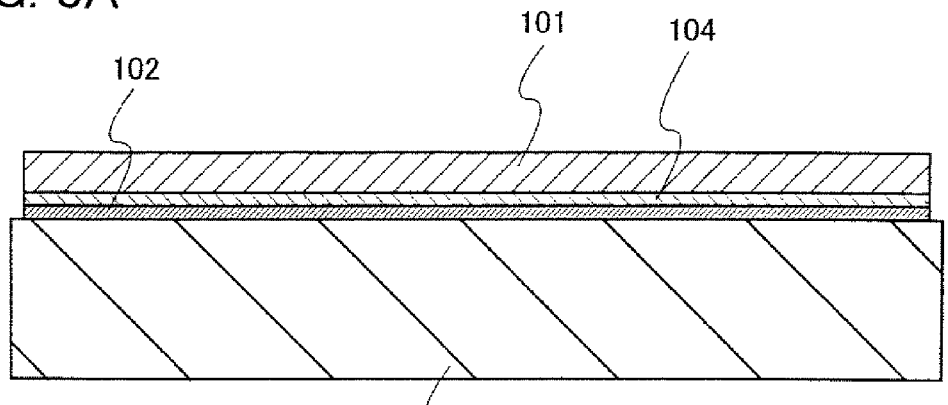
FIGS. 3A to 3C are cross-sectional views each showing a manufacturing process of a semiconductor device of the present invention.

FIG. 3A shows a structure in which an insulating layer 104 is provided between the LTSS layer 101 and the bonding layer 102. It is preferable that the insulating layer 104 be an insulating layer containing nitrogen. For example, the insulating layer 104 can be formed by using a single film or a plurality of stacked films selected from a silicon nitride film, a silicon nitride film containing oxygen, or a silicon oxide film containing nitrogen.

For example, as the insulating layer 104, a stacked-layer film can be used which is obtained by stacking a silicon oxide film containing nitrogen and a silicon nitride film containing oxygen from the LTSS layer 101 side. The bonding layer 102 functions to form a bond with the supporting substrate 100, whereas the insulating layer 104 prevents the LTSS layer 101 from being contaminated by an impurity.

Note that here, a silicon oxide film containing nitrogen corresponds to a film which contains much oxygen than nitrogen and includes oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Further, a silicon nitride film containing oxygen corresponds to a film which contains much nitrogen than oxygen and includes oxygen, nitrogen, silicon, and hydrogen at concentrations ranging from 15 atomic % to 30 atomic %, 20 atomic % to 35 atomic %, 25 atomic % to 35 atomic %, and 15 atomic % to 25 atomic %, respectively.

Figure 3B:
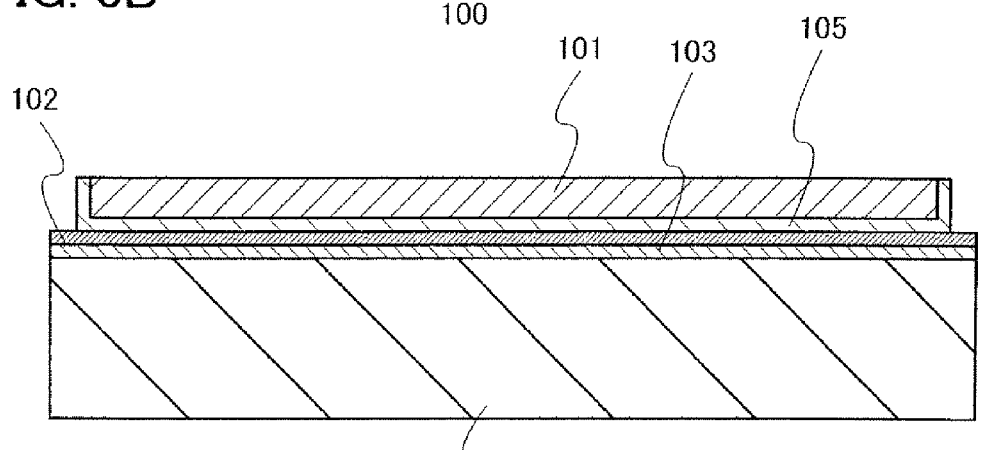

FIG. 3B shows a structure in which the supporting substrate 100 is provided with the bonding layer 102. The barrier layer 103 is preferably provided between the supporting substrate 100 and the bonding layer 102. This is in order to prevent the LTSS layer 101 from being contaminated by a mobile ion impurity like alkali metal or alkaline earth metal that is diffused from a glass substrate which is used as the supporting substrate 100. A silicon oxide layer 105 is formed on the LTSS layer 101 by direct oxidation. This silicon oxide layer 105 forms a bond with the bonding layer 102 and fixes the LTSS layer over the supporting substrate 100. It is preferable that the silicon oxide layer 105 be formed by thermal oxidation.

Figure 3C:
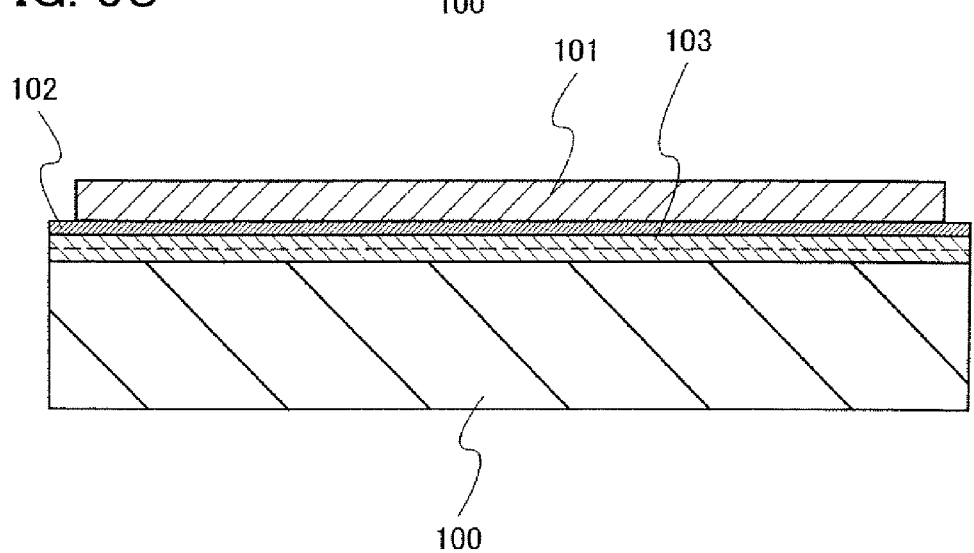

FIG. 3C shows another structure in which the supporting substrate 100 is provided with the bonding layer 102. The barrier layer 103 is provided between the supporting substrate 100 and the bonding layer 102.

In FIG. 3C, the barrier layer 103 is formed of a single layer or a plurality of layers. For example, a silicon nitride film or a silicon nitride film containing oxygen which is highly effective in blocking ions of sodium or the like is used as a first layer, and a silicon oxide film or a silicon oxide film containing nitrogen is provided thereover as a second layer.

The first layer of the barrier layer 103 is a dense insulating film with a purpose to prevent impurity diffusion, whereas one of purposes of the second layer is to relax stress so that internal stress of the film of the first layer does not affect the upper layer. By provision of the barrier layer 103 over the supporting substrate 100 as described above, the range of choices of the substrate in bonding the LTSS layer can be expanded.

The bonding layer 102 is formed over the barrier layer 103 to fix the supporting substrate 100 and the LTSS layer 101.

Methods for manufacturing the substrates having an SOI structure shown in FIGS. 2A and 2B and FIGS. 3A to 3C are described with reference to FIGS. 4A to 4C, FIGS. 5A and 5B, FIGS. 6A to 6C, FIGS. 7A to 7C, FIGS. 8A and 8B, and FIGS. 9A to 9C.

Figure 4A:
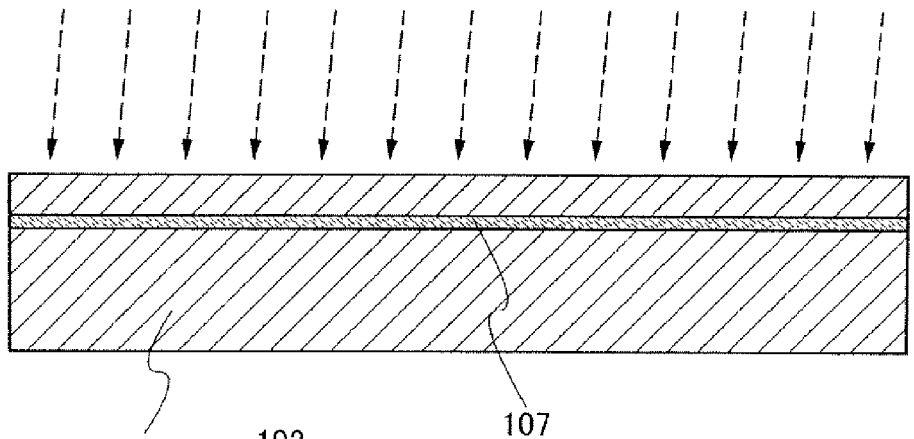
FIGS. 4A to 4C are cross-sectional views showing a manufacturing process of a semiconductor device of the present invention.

Ions that are accelerated by an electric field are implanted into a predetermined depth through a cleaned surface of a semiconductor substrate 106 to form a separation layer 107 (see FIG. 4A). The depth at which the separation layer 107 is formed in the semiconductor substrate 106 is controlled by ion accelerating energy and ion incident angle. The separation layer 107 is formed in a region at a depth close to the average penetration depth of the ions from the surface of the semiconductor substrate 106. For example, the thickness of an LTSS layer is 5 nm to 500 nm, preferably 10 nm to 200 nm, and the accelerating voltage at the time of implanting the ions is determined in consideration of such a thickness. Ion implantation is preferably performed using an ion doping apparatus. In other words, a doping method is used, in which a plurality of ion species which are generated from plasma of a source gas are implanted without being mass separated.

In this embodiment mode, it is preferable that one or a plurality of ions of the same atom with different masses be implanted. Ion doping may be performed with an accelerating voltage of 10 keV to 100 keV, preferably 30 keV to 80 keV, at a dose of $1\times10^{16}$/cm$^2$ to $4\times10^{16}$/cm$^2$, and with a beam current density of greater than or equal to 2 μA/cm$^2$, preferably greater than or equal to 5 μA/cm$^2$, and more preferably greater than or equal to 10 μA/cm$^2$.

In the case of implanting hydrogen ions, the hydrogen ions preferably include $H_+$, $H_2^+$, and $H_3^+$ ions with a high proportion of $H_3^+$ ions. In the case of implanting hydrogen ions, when the hydrogen ions are made to include $H^+$, $H_2^+$, and $H_3^+$ ions with a high proportion of $H_3^+$ ions, implantation efficiency can be increased and implantation time can be shortened. Accordingly, the separation layer 107 formed in the semiconductor substrate 106 can be made to contain hydrogen of greater than or equal to $1\times10^{20}$/cm$^3$ (preferably $5\times10^{20}$/cm$^3$).

When a high-concentration hydrogen-implanted region is locally formed in the semiconductor substrate 106, a crystal structure is disordered and microvoids are formed, whereby the separation layer 107 can be made to have a porous structure. In this case, by heat treatment at relatively low temperature, a change occurs in the volume of the microvoids formed in the separation layer 107, which enables cleavage to occur along the separation layer 107 and enables a thin LTSS layer to be formed.

Even if ions are implanted into the semiconductor substrate 106 with mass separation being performed, the separation layer 107 can similarly be formed as described above. Also in this case, selective implantation of ions with large mass (for example, $H_3^+$ ions) is also preferable because effects similar to those described above can be achieved.

As a gas from which ions are generated, deuterium or an inert gas such as helium, as well as hydrogen, can be selected. With the use of helium as a source gas and an ion doping apparatus which does not have a mass separation function, an ion beam with a high proportion of He$^+$ ions can be obtained. By implantation of such ions into the semiconductor substrate 106, microvoids can be formed and the separation layer 107 similar to that described above can be formed in the semiconductor substrate 106.

In formation of the separation layer 107, ions need to be implanted at a high dose, and there are cases where the surface of the semiconductor substrate 106 is roughened. Therefore, a surface, through which ions are implanted, may be provided with a dense film. For example, a protective film against ion implantation, which is formed of a silicon nitride film, a silicon nitride film containing oxygen, or the like, may be provided with a thickness of 50 nm to 200 nm.

Figure 4B:
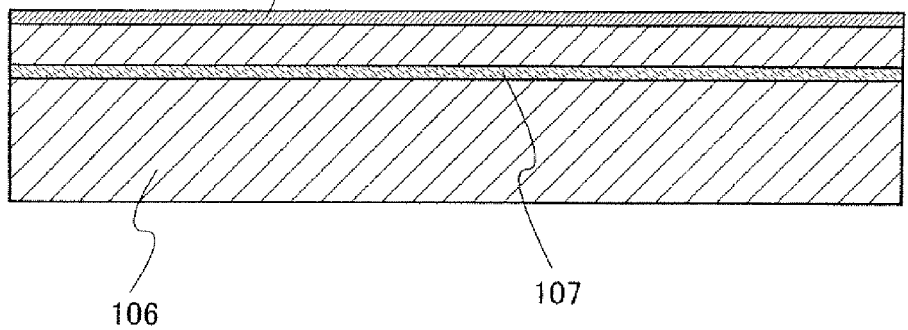

Next, a silicon oxide film is formed as a bonding layer 102 on a surface which is to form a bond with a supporting substrate 100 (see FIG. 4B). The thickness of the silicon oxide film may be 10 nm to 200 nm, preferably 10 nm to 100 nm, more preferably 20 nm to 50 nm.

As the silicon oxide film, a silicon oxide film formed by a chemical vapor deposition method with the use of an organic silane gas as described above is preferable. Alternatively, a silicon oxide film formed by a chemical vapor deposition method with the use of a silane gas can be used. Film formation by a chemical vapor deposition method is performed at a temperature of, for example, less than or equal to 350° C., at which degassing of the separation layer 107 which is formed in a single-crystal semiconductor substrate does not occur. In addition, heat treatment for separation of an LTSS layer from a single-crystal or polycrystalline semiconductor substrate is performed at a temperature higher than the film formation temperature.

Figure 4C:
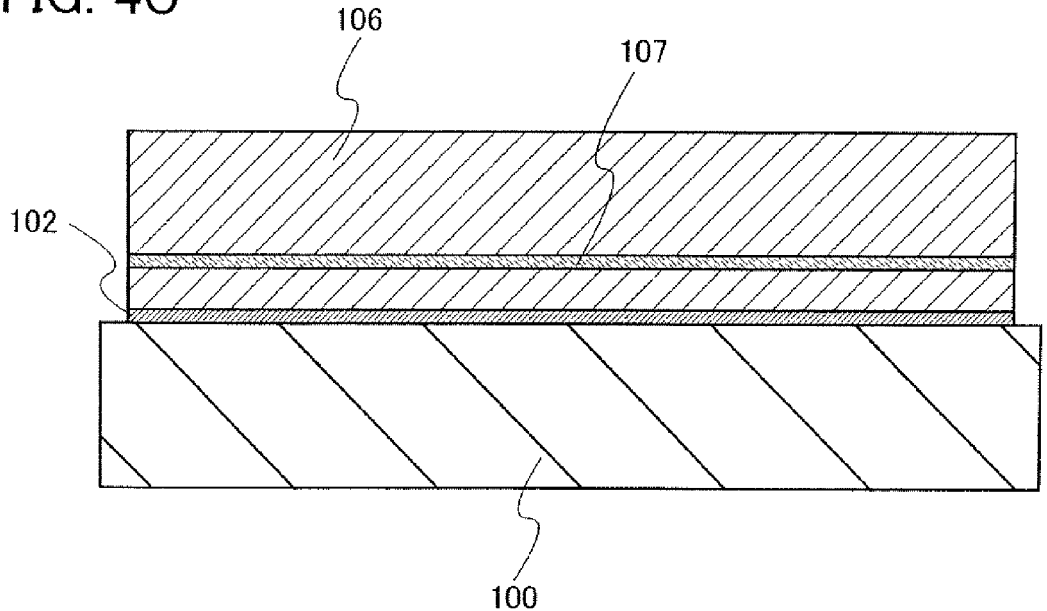

A bond is formed by making the supporting substrate 100 and the surface of the semiconductor substrate 106 where the bonding layer 102 is formed face each other and be in close contact with each other (see FIG. 4C). A surface which is to form a bond is cleaned sufficiently. Then, the supporting substrate 100 and the bonding layer 102 are disposed in close contact with each other, whereby a bond is formed. It can be considered that Van der Waals forces act at the initial stage of bonding and that a strong bond due to hydrogen bonds can be formed by pressure bonding of the supporting substrate 100 and the semiconductor substrate 106.

In order to form a favorable bond, a surface may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such surface treatment makes it possible to increase bonding strength between different kinds of materials even at a temperature of 200° C. to 400° C.

First heat treatment is performed in a state where the semiconductor substrate 106 and the supporting substrate 100 are superposed on each other. By the first heat treatment, separation of the semiconductor substrate 106 is performed with a thin semiconductor layer (an LTSS layer) left over the supporting substrate 100 (see FIG. 5A). The first heat treatment is preferably performed at a temperature of greater than or equal to the temperature at which the bonding layer 102 is formed, preferably at a temperature of greater than or equal to 400° C. and less than 600° C. Through the heat treatment performed within this temperature range, a change occurs in the volume of the microvoids formed in the separation layer 107, which enables a semiconductor layer to be cleaved along the separation layer 107. Since the bonding layer 102 is bonded to the supporting substrate 100, an LTSS layer 101 having the same crystallinity as the semiconductor substrate 106 is fixed over the supporting substrate 100 in this mode.

Figure 5A:
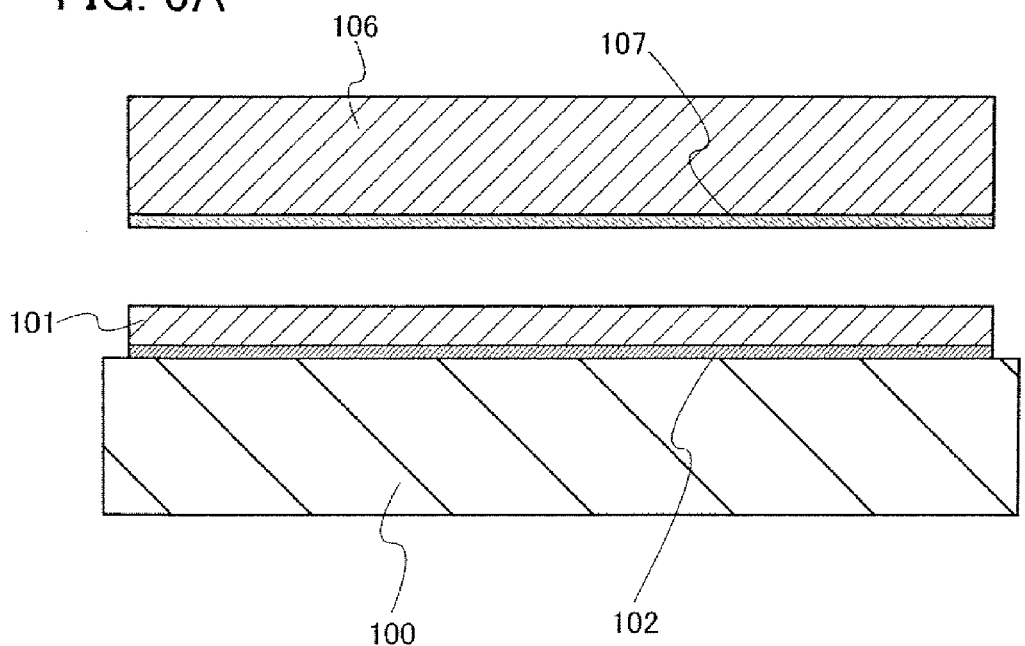
FIGS. 5A and 5B are cross-sectional views showing a manufacturing process of a semiconductor device of the present invention.
Figure 5B:
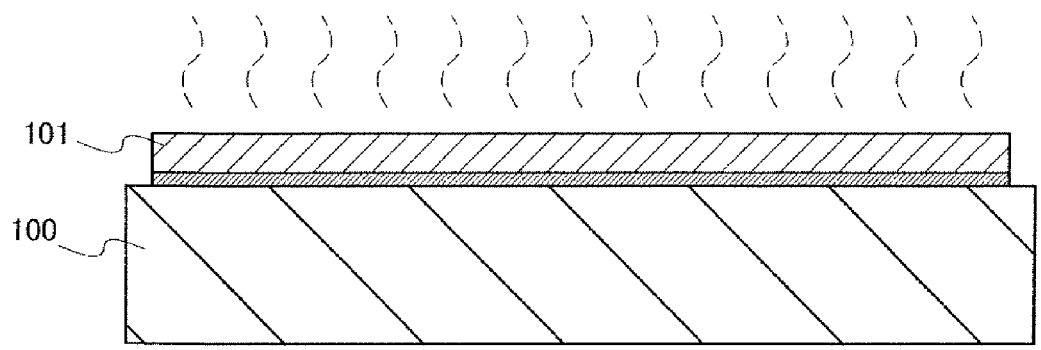

Next, second heat treatment is performed in a state where the LTSS layer 101 is bonded to the supporting substrate 100 (see FIG. 5B). It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. As a heat treatment apparatus, an electrically heated oven, a lamp annealing furnace, or the like can be used. The second heat treatment may be performed with multilevel changes of temperature. Alternatively, a rapid thermal annealing (RTA) apparatus may be used. When the heat treatment is performed using an RTA apparatus, heating up to near a substrate strain point or a slightly higher temperature is also possible.

Through the second heat treatment, residual stress of the LTSS layer 101 can be relaxed. In other words, the second heat treatment can relax thermal distortion caused by a difference in coefficient of expansion between the supporting substrate 100 and the LTSS layer 101. In addition, the second heat treatment is effective in recovering the crystallinity of the LTSS layer 101 which is impaired by ion implantation. Furthermore, the second heat treatment is also effective in recovering damage of the LTSS layer 101 which is caused when the semiconductor substrate 106 is bonded to the supporting substrate 100 and then divided by the first heat treatment. Moreover, by the first heat treatment and the second heat treatment, hydrogen bonds can be chanced into stronger covalent bonds.

For the purpose of planarization of the surface of the LTSS layer 101, a chemical mechanical polishing (CMP) process may be performed. The CMP process can be performed after the first heat treatment or the second heat treatment. Note that when the CMP process is performed before the second heat treatment, it is possible to recover a damaged layer on the surface caused due to the CMP process as well as to planarize the surface of the LTSS layer 101.

In any event, by the first heat treatment and the second heat treatment performed in combination as described in this embodiment mode, a crystalline semiconductor layer with excellent crystallinity can be provided over a supporting substrate which is weak against heat such as a glass substrate.

Through the steps of FIGS. 4A to 4C and FIGS. 5A and 5B, the SOI substrate shown in FIG. 2A is formed.

A method for forming the substrate having an SOI structure shown in FIG. 2B is described with reference to FIGS. 8A and 8B.

Based on the manufacturing steps shown in FIGS. 4A to 4C, a separation layer 107 is formed in a semiconductor substrate 106, and a bonding layer 102 is formed on a surface of the semiconductor substrate 106 which is to form a bond with a supporting substrate 100.

Figure 8A:
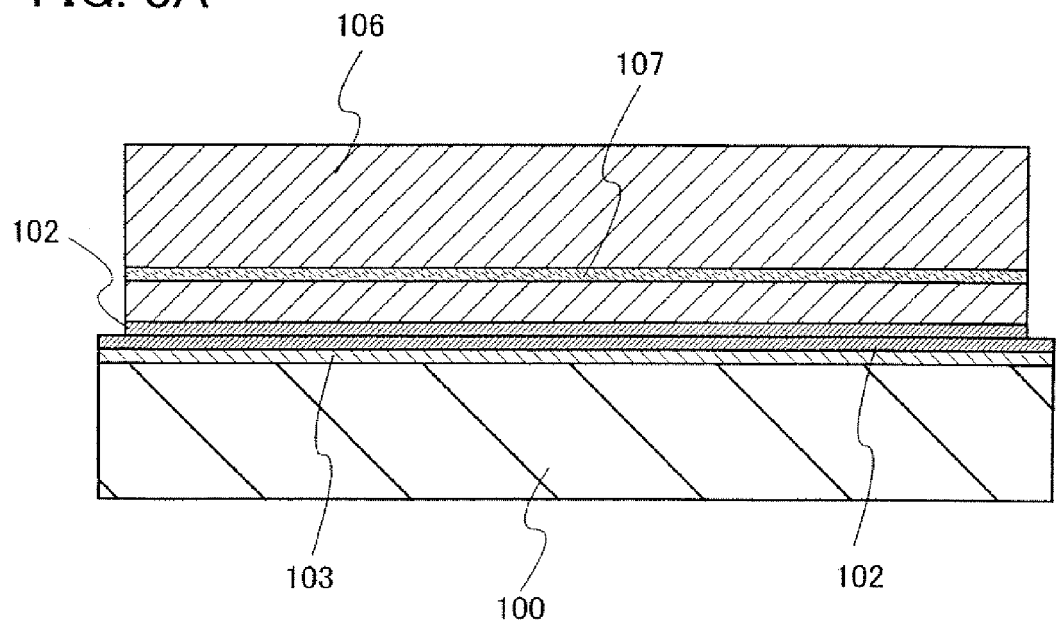
FIGS. 8A and 8B are cross-sectional views showing a manufacturing process of a semiconductor device of the present invention.
Figure 8B:
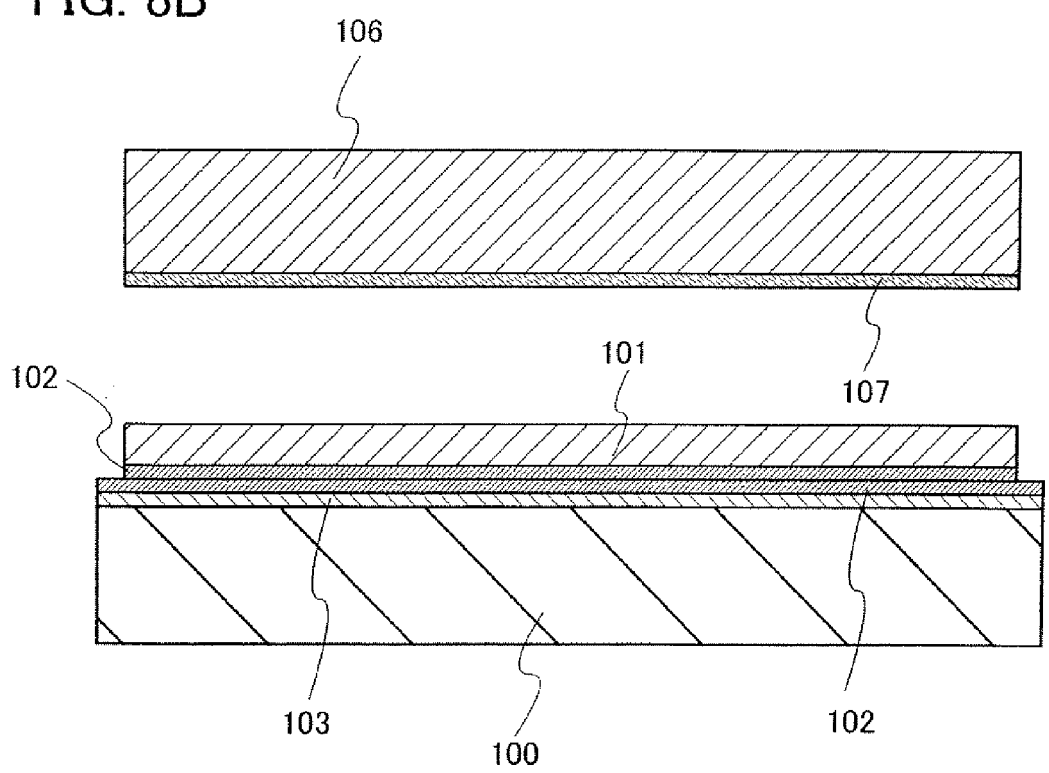

Next, the supporting substrate 100 provided with a barrier layer 103 and a bonding layer 102 is disposed in close contact with the bonding layer 102 of the semiconductor substrate 106 to form a bond (see FIG. 8A).

In this state, first heat treatment is performed. The first heat treatment is preferably performed at a temperature of greater than or equal to the temperature at which the bonding layer 102 is formed, preferably at a temperature of greater than or equal to 400° C. and less than 600° C. Accordingly, a change occurs in the volume of the microvoids formed in the separation layer 107, which enables cleavage in the semiconductor substrate 106. An LTSS layer 101 having the same crystallinity as that of the semiconductor substrate 106 is formed over the supporting substrate 100 (see FIG. 8B).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

In the above-described manner, the SOI substrate shown in FIG. 2B is formed.

Next, a method for manufacturing the substrate having an SOI structure shown in FIG. 3A is described with reference to FIGS. 9A to 9C.

First, based on the manufacturing step shown in FIG. 4A, a separation layer 107 is formed in a semiconductor substrate 106.

Next, an insulating layer 104 is formed on the surface of the semiconductor substrate 106. It is preferable that the insulating layer 104 be an insulating layer containing nitrogen. For example, the insulating layer 104 can be formed using a single film or a plurality of stacked films selected from a silicon nitride film, a silicon nitride film containing oxygen, or a silicon oxide film containing nitrogen.

Figure 9A:
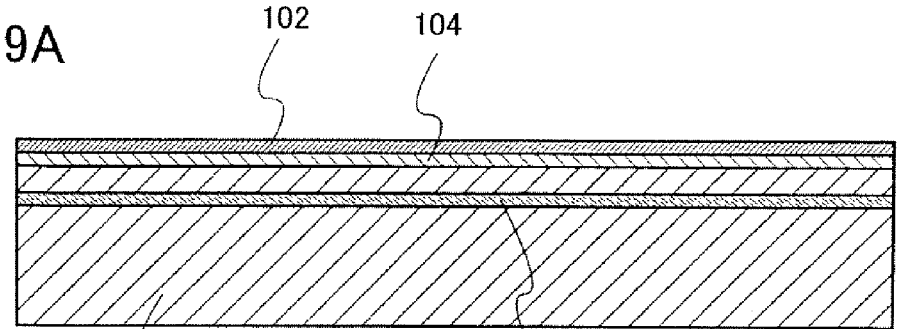
FIGS. 9A to 9C are cross-sectional views showing a manufacturing process of a semiconductor device of the present invention.

Furthermore, a silicon oxide film is formed as a bonding layer 102 over the insulating layer 104 (see FIG. 9A).

Figure 9B:
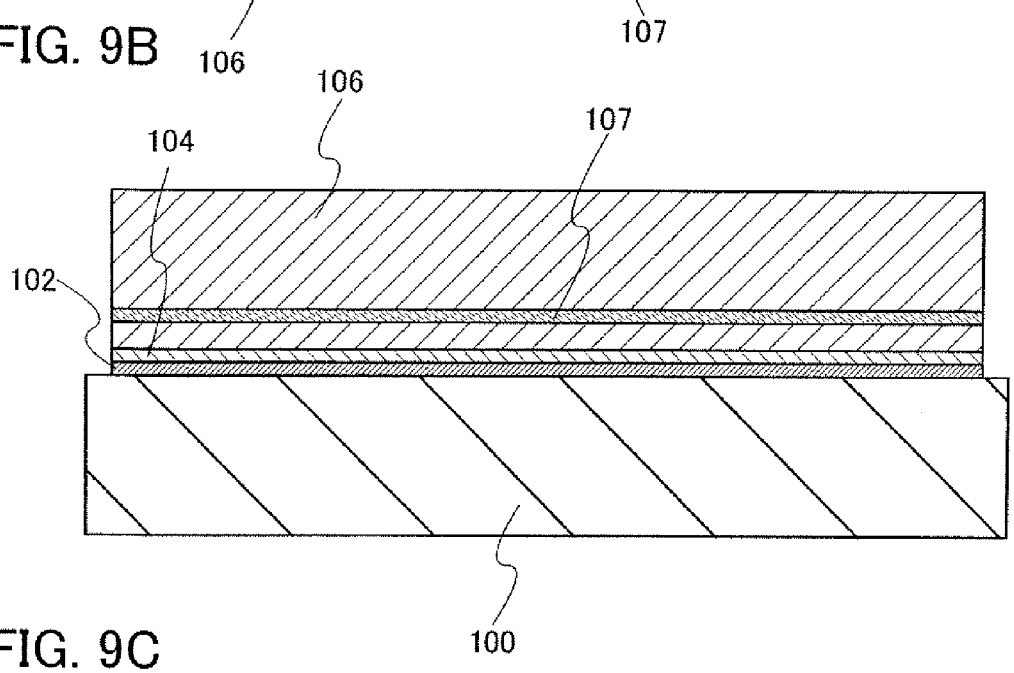

A bond is formed by making a supporting substrate 100 and the surface of the semiconductor substrate 106 where the bonding layer 102 is formed face each other and be in close contact with each other (see FIG. 9B).

In this state, first heat treatment is performed. The first heat treatment is preferably performed at a temperature of greater than or equal to the temperature at which the bonding layer 102 is formed, preferably at a temperature of greater than or equal to 400° C. and less than 600° C. Accordingly, a change occurs in the volume of the microvoids formed in the separation layer 107, which enables cleavage in the semiconductor substrate 106. An LTSS layer 101 having the same crystallinity as that of the semiconductor substrate 106 is formed over the supporting substrate 100 (see FIG. 9C).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

Figure 9C:
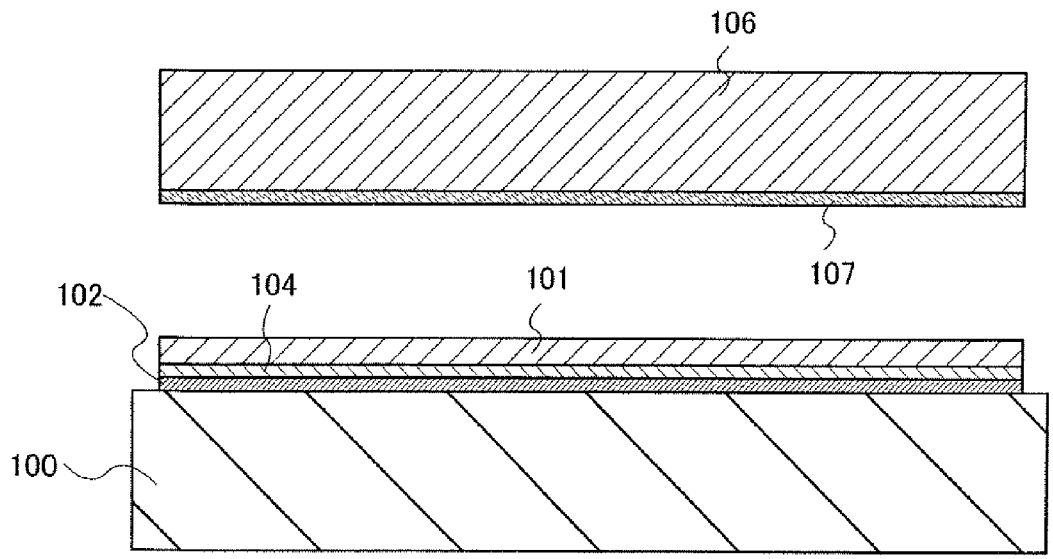

When the insulating layer 104 is formed over the semiconductor substrate 106 as shown in FIGS. 9A to 9C, the insulating layer 104 prevents an impurity from being mixed into the LTSS layer 101; accordingly, the LTSS layer 101 can be prevented from being contaminated.

Figure 6A:
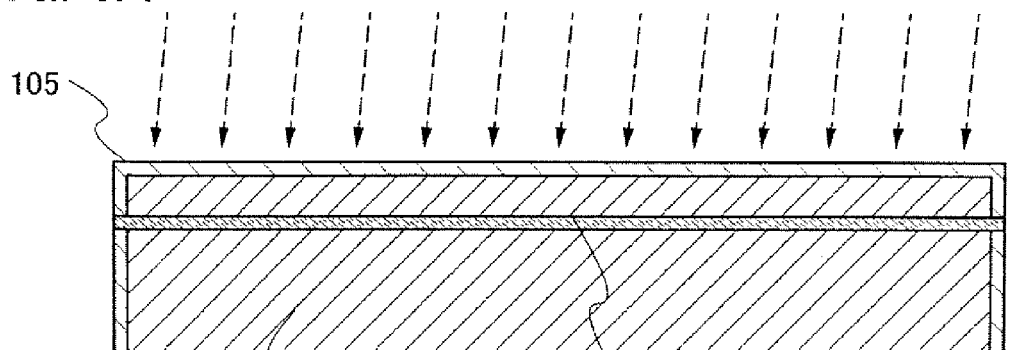
FIGS. 6A to 6C are cross-sectional views showing a manufacturing process of a semiconductor device of the present invention.
Figure 6B:
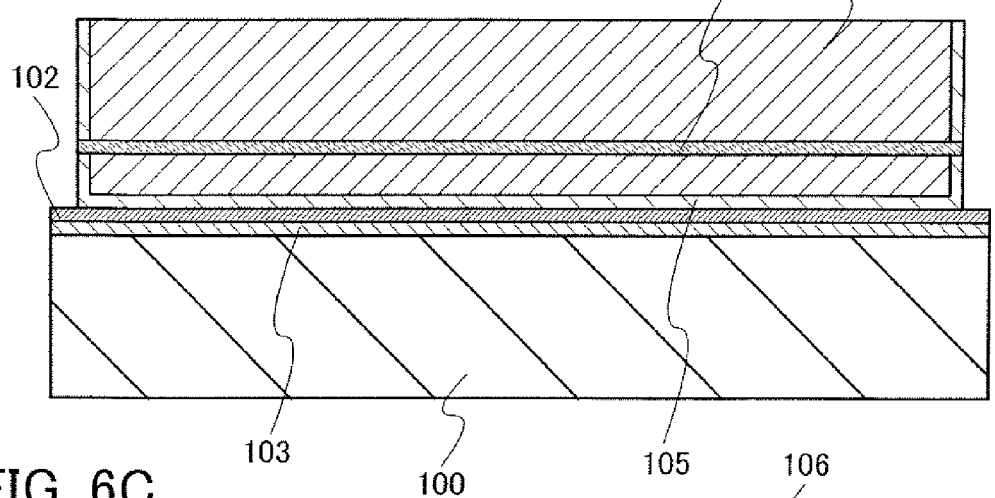
Figure 6C:
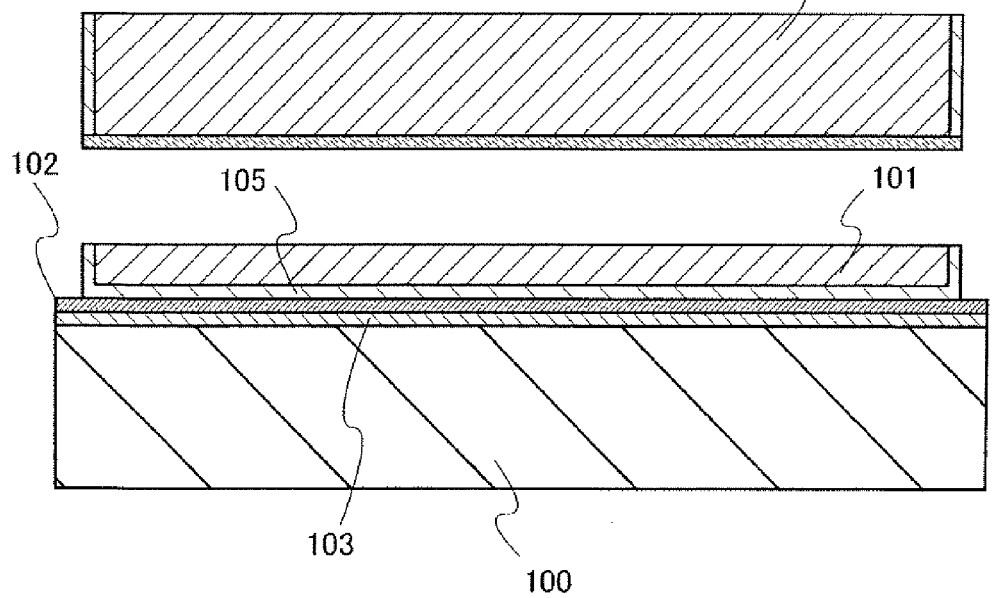

FIGS. 6A to 6C show steps of providing a bonding layer on a supporting substrate side and manufacturing a substrate having an SOI structure with an LTSS layer.

First, ions that are accelerated by an electric field are implanted into a semiconductor substrate 106, on which a silicon oxide layer 105 is formed, to a predetermined depth; therefore, a separation layer 107 is formed (see FIG. 6A). The silicon oxide layer 105 may be formed over the semiconductor substrate 106 by a sputtering method or a CVD method, or when the semiconductor substrate 106 is a single-crystal silicon substrate, the silicon oxide layer 105 may be formed by thermal oxidation of the semiconductor substrate 106. In this embodiment mode, the semiconductor substrate 106 is a single-crystal silicon substrate, and the silicon oxide layer 105 is formed by thermal oxidation of the single-crystal silicon substrate.

The implantation of ions into the semiconductor substrate 106 is performed in a manner similar to the case of FIG. 4A. By formation of the silicon oxide layer 105 on the surface of the semiconductor substrate 106, the surface can be prevented from being damaged by ion implantation and losing its planarity.

A supporting substrate 100 provided with a barrier layer 103 and a bonding layer 102 is disposed in close contact with the surface of the semiconductor substrate 106 where the silicon oxide layer 105 is formed to form a bond (see FIG. 6B).

In this state, first heat treatment is performed. The first heat treatment is preferably performed at a temperature of greater than or equal to the temperature at which the bonding layer 102 is formed, preferably at a temperature of greater than or equal to 400° C. and less than 600° C. Accordingly, a change occurs in the volume of the microvoids formed in the separation layer 107, which enables cleavage in the semiconductor substrate 106. An LTSS layer 101 having the same crystallinity as that of the semiconductor substrate 106 is formed over the supporting substrate 100 (see FIG. 6C).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

In the above-described manner, the SOI substrate shown in FIG. 3B is formed.

Figure 7A:
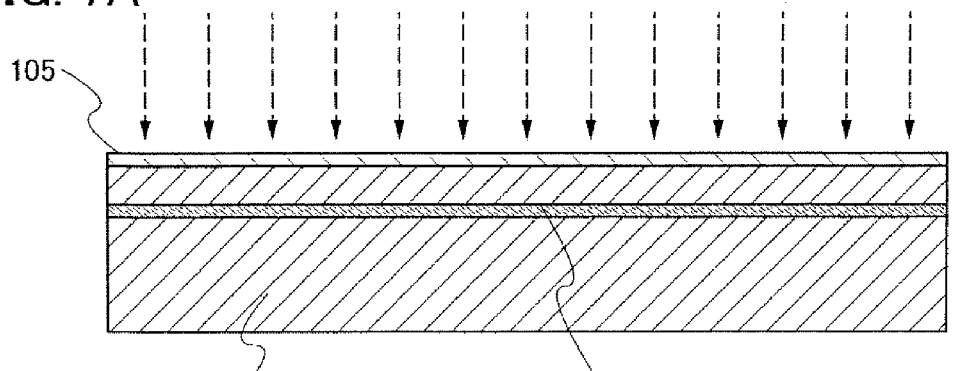
FIGS. 7A to 7C are cross-sectional views showing a manufacturing process of a semiconductor device of the present invention.
Figure 7B:
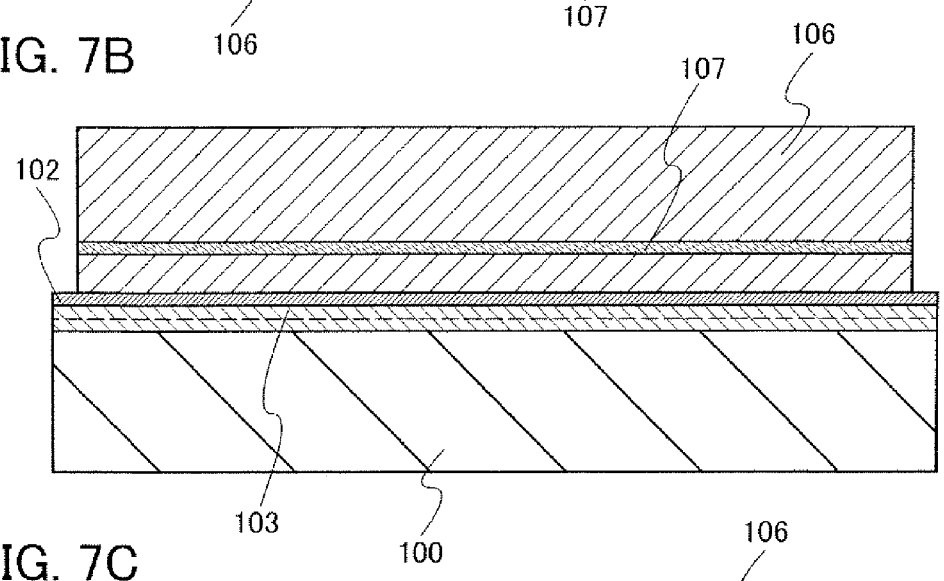
Figure 7C:
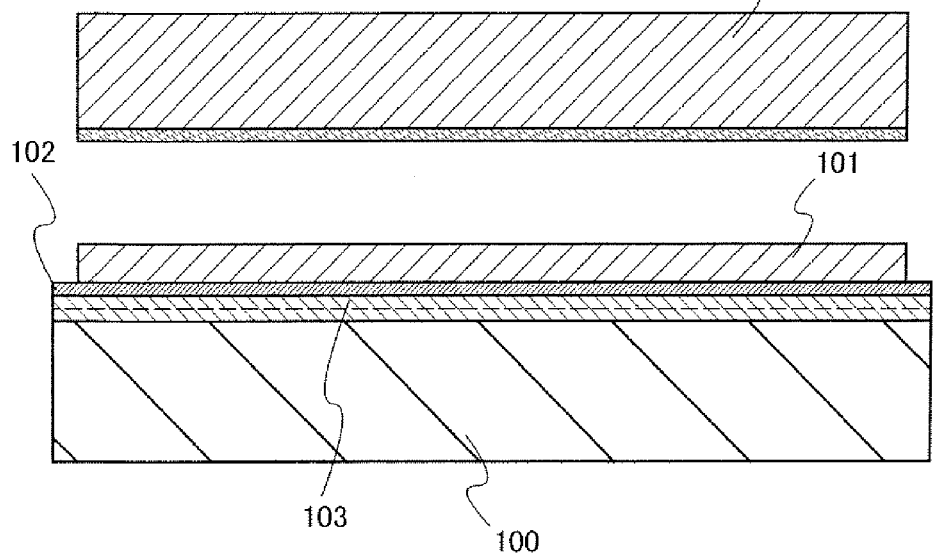

FIGS. 7A to 7C show another example in the case where a bonding layer is provided on a supporting substrate side to bond an LTSS layer.

First, a separation layer 107 is formed in a semiconductor substrate 106 (see FIG. 7A). The implantation of ions for formation of the separation layer 107 is performed using an ion doping apparatus. In this step, ions with different masses are accelerated by a high electric field to irradiate the semiconductor substrate 106.

At this time, it is preferable that a silicon oxide layer 105 be provided as a protective film because the planarity of the surface of the semiconductor substrate 106 might be impaired by ion irradiation. The silicon oxide layer 105 may be formed by thermal oxidation or by using a chemical oxide. A chemical oxide can be formed by immersion of the semiconductor substrate 106 in an oxidizing chemical solution. For example, with treatment of the semiconductor substrate 106 with an aqueous solution containing ozone, a chemical oxide is formed on the surface.

Alternatively, as the protective film, a silicon oxide film containing nitrogen or a silicon nitride film containing oxygen formed by a plasma CVD method, or a silicon oxide film formed using TEOS may be used.

It is preferable that a supporting substrate 100 be provided with a barrier layer 103. By provision of the barrier layer 103, an LTSS layer 101 can be prevented from being contaminated by a mobile ion impurity like alkali metal or alkaline earth metal that is diffused from a glass substrate which is used as the supporting substrate 100.

The barrier layer 103 is formed of a single layer or a plurality of layers. For example, a silicon nitride film or a silicon nitride film containing oxygen which is highly effective in blocking ions of sodium or the like is used as a first layer, and a silicon oxide film or a silicon oxide film containing nitrogen is provided thereover as a second layer.

The first layer of the barrier layer 103 is a dense insulating film with a purpose to prevent impurity diffusion, whereas one of purposes of the second layer is to relax stress so that internal stress of the film of the first layer does not affect the upper layer. By provision of the barrier layer 103 over the supporting substrate 100 as described above, the range of choices of the substrate in bonding the LTSS layer can be expanded.

The supporting substrate 100 provided with a bonding layer 102 over the barrier layer 103 and the semiconductor substrate 106 are bonded to each other (see FIG. 7B). The surface of the semiconductor substrate 106 is exposed by removal of the silicon oxide layer 105, which has been provided as a protective film, with a hydrofluoric acid. The outermost surface of the semiconductor substrate 106 may be in a state where the surface is terminated with hydrogen by treatment with a hydrofluoric acid solution. In formation of the bond, hydrogen bonds are formed by surface-terminating hydrogen, and a favorable bond can be formed.

Furthermore, irradiation with ions of an inert gas may be performed so that dangling bonds are exposed on the outermost surface of the semiconductor substrate 106, and a bond may be formed in vacuum.

In this state, first heat treatment is performed. The first heat treatment is preferably performed at a temperature of greater than or equal to the temperature at which the bonding layer 102 is formed, preferably at a temperature of greater than or equal to 400° C. and less than 600° C. Accordingly, a change occurs in the volume of the microvoids formed in the separation layer 107, which enables cleavage in the semiconductor substrate 106. An LTSS layer 101 having the same crystallinity as that of the semiconductor substrate 106 is formed over the supporting substrate 100 (see FIG. 7C).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time.

The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

In the above-described manner, the SOI substrate shown in FIG. 3C is formed.

According to this embodiment mode, even if the supporting substrate 100 having an allowable temperature limit of less than or equal to 700° C. such as a glass substrate is used, the LTSS layer 101 which has a strong bonding force in a bonding portion can be obtained. As the supporting substrate 100, it is possible to use any of a variety of glass substrates that are used in the electronics industry and that are referred to as non-alkali glass substrates, such as aluminosilicate glass substrates, aluminoborosilicate glass substrates, and barium borosilicate glass substrates. In other words, a single-crystal semiconductor layer can be formed over a substrate that is longer than one meter on each side. With the use of such a large-sized substrate, not only a display device such as a liquid crystal display but also a semiconductor integrated circuit can be manufactured.

Embodiment Mode 3

In this embodiment mode, an example of manufacturing a semiconductor device capable of wireless communication with the use of the present invention will be described with reference to FIGS. 10A to 10E, FIGS. 11A to 11E, FIGS. 12A to 12D, and FIGS. 13A and 13B.

Figure 10A:
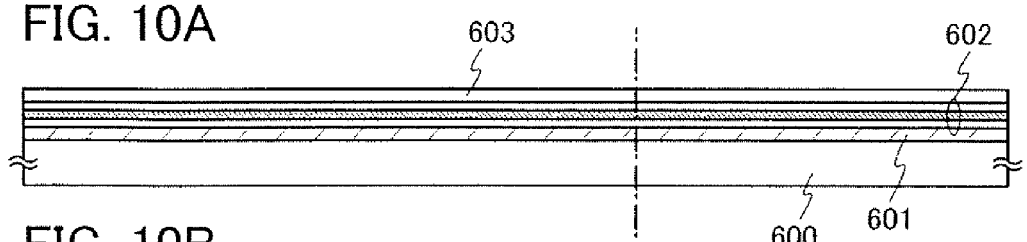
FIGS. 10A to 10E are cross-sectional views showing a manufacturing process of a semiconductor device of the present invention.

First, a separation layer 601 is formed over a first substrate 600 having heat resistance as shown in FIG. 10A. The first substrate 600 can be, for example, a glass substrate such as a barium borosilicate glass substrate or an aluminoborosilicate glass substrate, a quartz substrate, a ceramic substrate, or the like. Moreover, the first substrate 600 may be a semiconductor substrate or a metal substrate including a stainless steel substrate. A substrate formed of a synthetic resin having flexibility, such as plastic, generally tends to have lower allowable temperature limit than the above-described substrates; however, the substrate can be used as long as it can withstand a processing temperature in manufacturing steps.

The separation layer 601 can be formed by a sputtering method, a reduced-pressure CVD method, a plasma CVD method, or the like by using a layer containing silicon such as amorphous silicon, polycrystalline silicon, single-crystal silicon, or microcrystalline silicon (including semi-amorphous silicon) as its main component. In this embodiment mode, the separation layer 601 is formed of amorphous silicon with a thickness of approximately 50 nm by a reduced-pressure CVD method. The material of the separation layer 601 is not limited to silicon and may be of any kind as long as it can be removed by etching, as selected. The thickness of the separation layer 601 is preferable in the range of from 10 nm to 100 nm. When semi-amorphous silicon is used, the thickness may be in the range of from 30 nm to 50 nm.

Next, a base film 602 is formed over the separation layer 601. The base film 602 is provided in order to prevent alkaline-earth metal or alkali metal such as Na in the first substrate 600 from diffusing into the semiconductor film, thereby preventing an adverse effect on characteristics of the semiconductor element such as a TFT (thin film transistor). The base film 602 also works to protect the semiconductor element during a later step of separating the semiconductor elements. The base film 602 may be either a single insulating film or a stack of a plurality of insulating films. Therefore, an insulating film which can prevent alkali metal and alkaline-earth metal from diffusing into the semiconductor film, such as a silicon oxide film, a silicon nitride film, or a silicon nitride oxide film is used.

In this embodiment mode, the base film 602 is formed in such a manner that a 100 nm thick silicon oxide film containing nitrogen, a 50 nm thick silicon nitride film containing oxygen, and a 100 nm thick silicon oxide film containing nitrogen are stacked in order; however, the material, thickness, and number of stacked films are not limited thereto. For example, the silicon oxide film containing nitrogen as the lower layer may be replaced by a siloxane-based resin film with a thickness of 0.5 μm to 3 μm which is formed by a spin coating method, a slit coating method, a droplet discharging method, a printing method, or the like. The silicon nitride film containing oxygen as the middle layer may be replaced by a silicon nitride film. The silicon oxide film containing nitrogen as the upper layer may be replaced by a silicon oxide film. The thickness of each film is preferably in the range of from 0.05 μm to 3 μm, and can be freely selected from that range.

Here, the silicon oxide film can be formed by thermal CVD, plasma CVD, atmospheric pressure CVD, bias ECRCVD, or the like with the use of a mixed gas of silane and oxygen, a mixed gas of TEOS (tetraethyl orthosilicate) and oxygen, or the like. The silicon nitride film can be formed typically by plasma CVD with the use of a mixed gas of $SiH_4$ and $NH_3$. The silicon oxide film containing nitrogen and the silicon nitride containing oxygen can be formed typically by plasma CVD with the use of a mixed gas of silane and nitrous oxide.

Next, a semiconductor film 603 is formed over the base film 602. It is preferable that the semiconductor film 603 be formed without being exposed to the atmosphere after the base film 602 is formed. The semiconductor film 603 has a thickness of 20 nm to 200 nm (preferably 40 nm to 170 nm, more preferably 50 nm to 150 nm). The semiconductor film 603 may be formed of an amorphous semiconductor, a semi-amorphous semiconductor, or a polycrystalline semiconductor. Silicon germanium as well as silicon may be used as the semiconductor. In the case of using silicon germanium, the concentration of germanium is preferably in the range of from approximately 0.01 atomic % to 4.5 atomic %.

The semiconductor film 603 may be crystallized by a known technique. Known crystallization methods include a laser crystallization method using laser light and a crystallization method using a catalytic element. Alternatively, a laser crystallization method using laser light and a crystallization method using a catalytic element may be used in combination. When a substrate excellent in heat resistance such as a quartz substrate is used as the first substrate 600, high-temperature annealing at approximately 950° C. may be combined with any of a thermal crystallization method using an electrically heated oven, a lamp annealing crystallization method using infrared light, or a crystallization method using a catalytic element.

For example, in the case of performing laser crystallization, the semiconductor film 603 is subjected to thermal annealing at 500° C. for 1 hour before laser crystallization. This thermal annealing is performed to increase the resistance of the semiconductor film 603 against laser. Then, a continuous wave solid-state laser is used to irradiate the semiconductor film 603 with laser light of any of second to fourth harmonic waves of a fundamental wave; thus, crystals with large grain diameter can be obtained. For example, typically, a second harmonic (532 nm) or a third harmonic (355 nm) of a Nd:YVO$_4$ laser (fundamental wave: 1064 nm) is preferably used. Specifically, laser light emitted from a continuous wave YVO$_4$ laser is converted into a harmonic wave through a non-linear optical element, and thus laser light with a power of 10 W is obtained. Then, the laser light is preferably shaped into rectangular or elliptical laser light on an irradiated surface through an optical system, and is delivered onto the semiconductor film 603. The power density of the laser light at this time is necessary to range from approximately 0.01 MW/cm$^2$ to 100 MW/cm$^2$ (preferably 0.1 MW/cm$^2$ to 10 MW/cm$^2$). The irradiation is then performed by setting the scanning speed in the range of from approximately 10 cm/sec to 2000 cm/sec.

Alternatively, the laser crystallization may be performed by using a pulsed laser light with a repetition rate of greater than or equal to 10 MHz, which is extremely higher than generally used lasers having a repetition rate of several tens to several hundreds of hertz. It is said that it takes several tens to several hundreds of nanoseconds to completely solidify a semiconductor film after the semiconductor film is irradiated with pulsed laser light. When the pulsed laser light has the above-described repetition rate, the semiconductor film can be irradiated with laser light before the semiconductor film melted by previous laser light is solidified. Therefore, a solid-liquid interface can be continuously moved in the semiconductor film so that a semiconductor film having crystal grains which have continuously grown in a scanning direction is formed. Specifically, it is possible to form an aggregation of crystal grains each having a width of approximately 10 μm to 30 μm in the scanning direction and a width of approximately 1 μm to 5 μm in a direction perpendicular to the scanning direction. It is also possible to form a semiconductor film having almost no crystal grain boundary at least in a channel direction of the TFT by forming a crystal grain of a single crystal that is extended long along the scanning direction.

The laser crystallization may be performed by simultaneously delivering continuous wave laser light of a fundamental wave and continuous wave laser light of a harmonic wave, or simultaneously delivering continuous wave laser light of a fundamental wave and pulsed laser light of a harmonic wave.

The laser light may be delivered in an inert gas atmosphere such as a rare gas or nitrogen. This can suppress the roughness of a semiconductor surface due to the laser irradiation and also suppress variation in threshold voltage caused by variation in interface state density.

By the above-described laser irradiation, the semiconductor film 603 with improved crystallinity is formed. Alternatively, a polycrystalline semiconductor may be formed in advance by a sputtering method, a plasma CVD method, a thermal CVD method, or the like.

Although the semiconductor film 603 is crystallized in this embodiment mode, the semiconductor film 603 may remain amorphous or microcrystalline without being crystallized and may be subjected to a process to be described below. A TFT using an amorphous semiconductor or a microcrystalline semiconductor has advantages of low cost and high yield because the number of manufacturing steps is smaller than that of a TFT using a polycrystalline semiconductor.

An amorphous semiconductor can be obtained by glow discharge decomposition of a gas containing silicon. As a typical gas containing silicon, SiH$_4$, and Si$_2$H$_6$ can be given. The gas containing silicon may be diluted with hydrogen or with hydrogen and helium.

Note that a semi-amorphous semiconductor refers to a film containing a semiconductor with an intermediate structure between an amorphous semiconductor and a crystalline semiconductor (including a single-crystal semiconductor and a polycrystalline semiconductor). The semi-amorphous semiconductor is a semiconductor having a third state that is stable in terms of free energy and is a crystalline substance having a short-range order and lattice distortion which can be dispersed with its grain diameter of 0.5 nm to 20 nm in a non-single-crystal semiconductor.

In order to terminate dangling bonds, the semi-amorphous semiconductor film contains hydrogen or halogen at a rate of at least greater than or equal to 1 atomic %. Here, such a semiconductor is referred to as a semi-amorphous semiconductor (SAS) for convenience. Moreover, a rare gas element such as helium, argon, krypton, or neon may be contained therein to further promote lattice distortion, so that stability is enhanced and a favorable semi-amorphous semiconductor can be obtained.

As a typical semi-amorphous semiconductor semi-amorphous silicon can be given. A Raman spectrum of the semi-amorphous silicon is shifted to a lower wavenumber than 520 cm$^{-1}$. The diffraction peaks of (111) and (220) which are thought to be derived from a Si crystalline lattice are observed by X-ray diffraction.

In addition, semi-amorphous silicon can be obtained by glow discharge decomposition of a gas containing silicon. As a typical gas containing silicon, SiH$_4$ is given, and Si$_2$H$_6$, SiH$_2$Cl$_2$, SiHCl$_3$, SiCl$_4$, SiF$_4$, or the like can be used as well as SiH$_4$. The gas containing silicon may be diluted with hydrogen or with a gas in which one or more of rare gas elements selected from helium, argon, krypton, or neon are added to hydrogen; therefore, the semi-amorphous silicon film can be easily formed. It is preferable that the gas containing silicon be diluted with a dilution ratio in the range of from 2 times to 1000 times.

Further, a carbide gas such as CH$_4$ or C$_2$H$_6$, a germanium gas such as GeH$_4$ or GeF$_4$, F$_2$, or the like may be mixed into the gas containing silicon so as to adjust the energy bandwidth within the range of from 1.5 eV to 2.4 eV or from 0.9 eV to 1.1 eV.

For example, in the case of using a gas in which H$_2$ is added to SiH$_4$ or a gas in which F$_2$ is added to SiH$_4$, the subthreshold coefficient (subthreshold swing (S value)) of the TFT can be less than or equal to 0.35 V/dec, typically 0.25 V/dec to 0.09 V/dec, and the mobility of carriers can be 10 cm$^2$/Vsec when the TFT is formed using the formed semi-amorphous silicon. When, a 19-stage ring oscillator is formed of the TFT using the above-described semi-amorphous silicon, for example, the oscillating frequency can obtain characteristics of greater than or equal to 1 MHz, preferably greater than equal to 100 MHz at a power supply voltage of 3 V to 5 V. In addition, at a power supply voltage of 3 V to 5 V, delay time per one stage of an inverter can be 26 ns, preferably less than or equal to 0.26 ns.

Figure 10B:
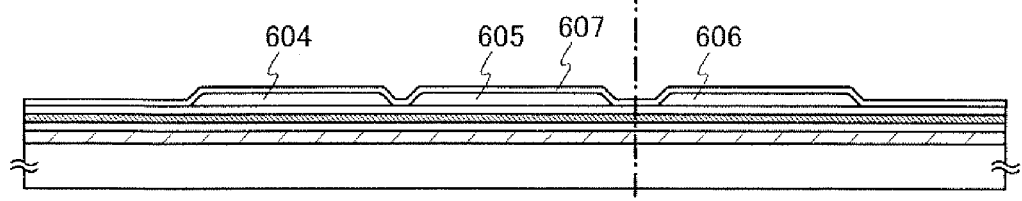

Next, as shown in FIG. 10B, an island-like semiconductor film 604, an island-like semiconductor film 605 and an island-like semiconductor film 606 are formed by etching the semiconductor film 603. Then, a gate insulating film 607 is formed so as to cover the island-like semiconductor films 604 to 606. The gate insulating film 607 can be formed by using a film containing silicon nitride, silicon oxide, silicon oxide containing nitrogen, or silicon nitride containing oxygen as a single layer or a stacked layer by a plasma CVD method, a sputtering method, or the like. In the case of stacking layers, for example, a three-layer structure of a silicon oxide film, a silicon nitride film, and a silicon oxide film formed in order from the substrate side is preferably employed.

Figure 10C:
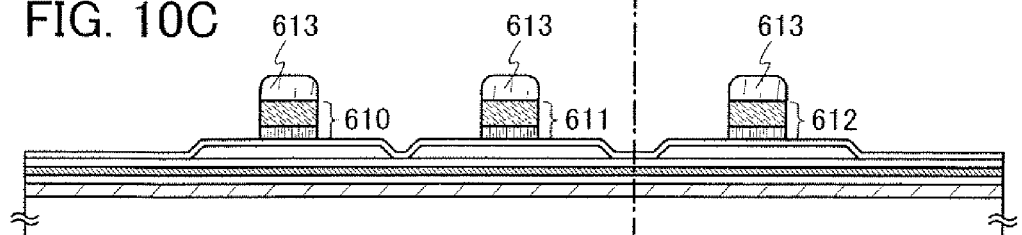

Next, a gate electrode 610, a gate electrode 611, and a gate electrode 612 are formed as shown in FIG. 10C. In this embodiment mode, the gate electrodes 610 to 612 are formed in such a way that tantalum nitride and tungsten are stacked in order by a sputtering method and then etching is performed with a resist 613 used as a mask. Needless to say, the material, structure, and manufacturing method of the gate electrodes 610 to 612 are not limited thereto and can be selected as appropriate. For example, a stacked-layer structure of nickel silicide and silicon doped with an impurity imparting n-type conductivity or a stacked-layer structure of tungsten silicide and silicon doped with an impurity imparting n-type conductivity may be employed. Alternatively, a single layer of various conductive materials may be used.

The resist mask may be replaced by a mask of silicon oxide or the like. In this case, a step of forming a mask of silicon oxide, silicon oxide containing nitrogen, or the like (called a hard mask) is added; however, the gate electrodes 610 to 612 can have desired widths because the film decrease of the mask is less than that of the resist mask at the time of etching. The gate electrodes 610 to 612 may be formed as selected by a droplet discharging method without using the resist 613.

As the conductive material, various materials can be selected depending on the function of a conductive film. When the gate electrodes and an antenna are formed at the same time, the material may be selected in consideration of their functions.

Note that as an etching gas in forming the gate electrodes by etching, a mixed gas of $CF_4$, $Cl_2$, and $O_2$, or a $Cl_2$ gas is used; however, the etching gas is not limited thereto.

Figure 10D:
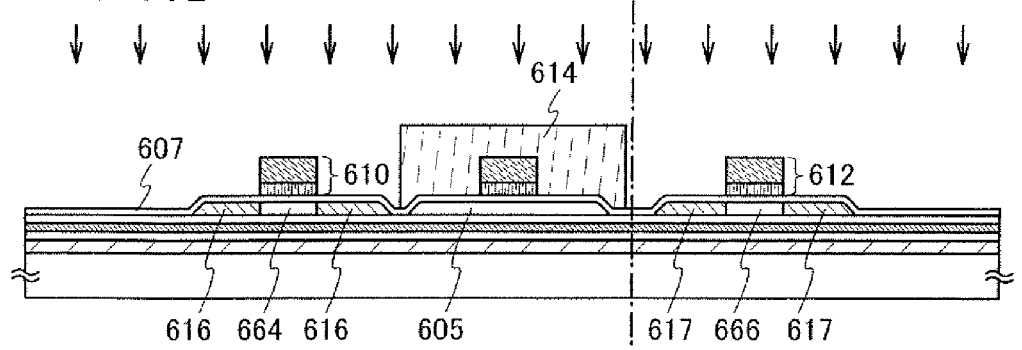

Next, as shown in FIG. 10D, the island-like semiconductor film 605 serving as a p-channel TFT is covered with a resist 614, and the island-like semiconductor films 604 and 606 are doped with an impurity element imparting n-type conductivity (typically P (phosphorus) or As (arsenic)) at low concentration with the use of the gate electrodes 610 and 612 as masks (a first doping step).

The first doping step is performed under the condition where the dose is in the range of from $1\times10^{13}/cm^2$ to $6\times10^{13}/cm^2$ and the accelerating voltage is in the range of from 50 keV to 70 keV; however, the condition is not limited thereto. In the first doping step, the doping is performed through the gate insulating film 607, and a pair of low-concentration impurity regions 616 and a pair of low-concentration impurity regions 617 are formed in the island-like semiconductor films 604 and 606, respectively. In addition, a channel formation region 664 is formed between the pair of Low-concentration impurity regions 616, and a channel formation region 666 is formed between the pair of low-concentration impurity regions 617. Note that the first doping step may be performed without covering with the resist the island-like semiconductor film 605 serving as a p-channel TFT.

Figure 10E:
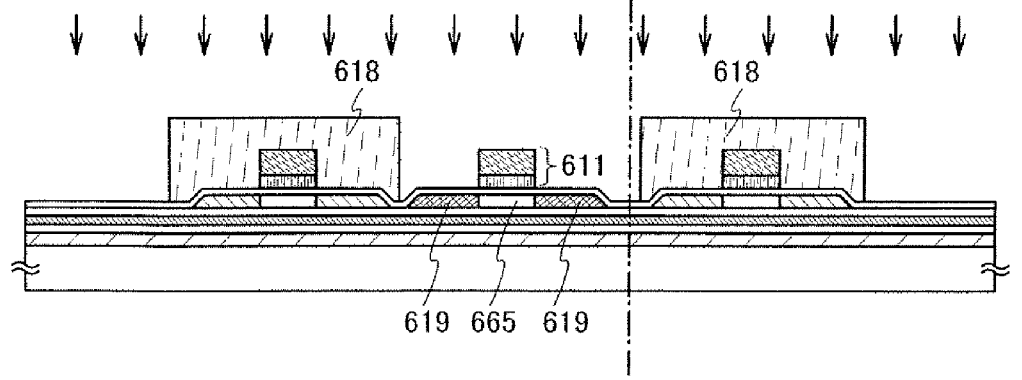

Next, as shown in FIG. 10E, after the resist 614 is removed by ashing or the like, a resist 618 is newly formed so as to cover the island-like semiconductor films 604 and 606 serving as n-channel TFTs. Then, the island-like semiconductor film 605 is doped with an impurity element imparting p-type conductivity (typically B (boron)) at high concentration with the use of the gate electrode 611 as a mask (a second doping step).

The second doping step is performed under the condition where the dose is in the range of from $1\times10^{16}/cm^2$ to $3\times10^{16}/cm^2$ and the accelerating voltage is in the range of from 20 keV to 40 keV. In the second doping step, the doping is performed through the gate insulating film 607, a pair of p-type high-concentration impurity regions 619 is formed in the island-like semiconductor film 605, and a channel formation region 665 is formed between the pair of p-type high concentration impurity regions 619.

Figure 11A:
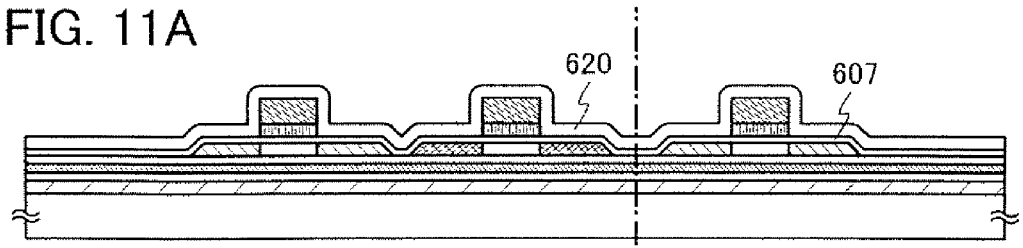
FIGS. 11A to 11E are cross-sectional views showing a manufacturing process of a semiconductor device of the present invention.

Next, as shown in FIG. 11A, after the resist 618 is removed by ashing or the like, an insulating film 620 is formed so as to cover the gate insulating film 607 and the gate electrodes 610 to 612. In this embodiment mode, a 100 nm thick silicon oxide film is formed by a plasma CVD method as the insulating film 620.

Figure 11B:
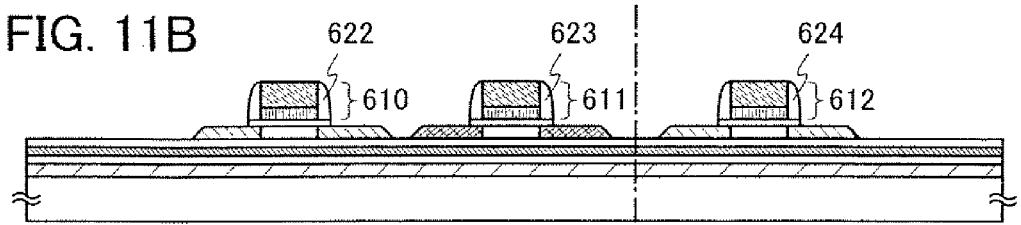

After that, the insulating film 620 and the gate insulating film 607 are partially etched by an etch back method to form a sidewall 622, a sidewall 623, and a sidewall 624 in a self-aligned manner so as to be in contact with side surfaces of the gate electrodes 610 to 612, as shown in FIG. 11B. A mixed gas of $CHF_3$ and He is used as an etching gas. Note that the step of forming the sidewalls is not limited thereto.

When the insulating film 620 is formed, the insulating film 620 may also be formed at a rear surface of the first substrate 600. In this case, the insulating film formed at the rear surface of the first substrate 600 may be removed by etching as selected by using a resist. In such a case, the insulating film formed on the rear surface may be removed by etching together with the insulating film 620 and the gate insulating film 607 at the time of forming the sidewalls 622 to 624 by an etch back method.

Figure 11C:
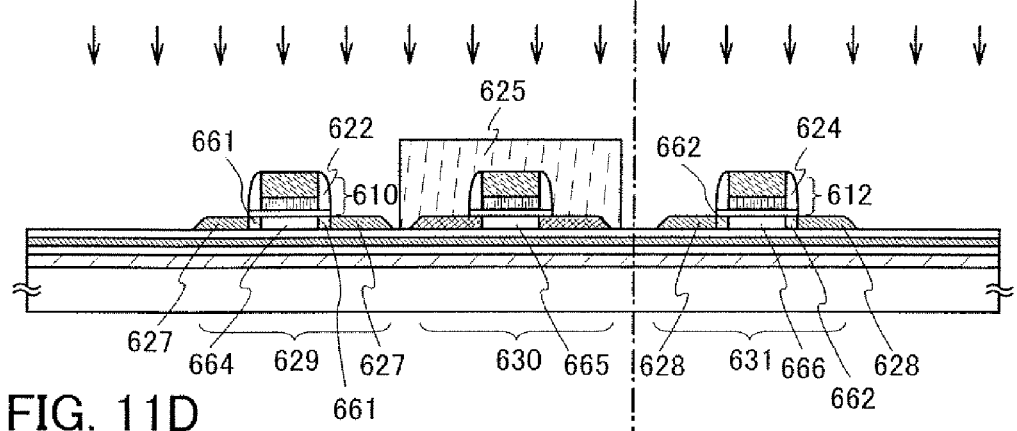

Next, as shown in FIG. 11C, a resist 625 is newly formed so as to cover the island-like semiconductor film 605 serving as a p-channel TFT. Then, an impurity element imparting n-type conductivity (typically phosphorus or arsenic) is added at high concentration with the use of the gate electrodes 610 and 612 and the sidewalls 622 and 624 as masks (a third doping step).

The third doping step is performed under the condition where the dose is in the range of from $1\times10^{13}/cm^2$ to $5\times10^{15}/cm^2$ and the accelerating voltage is in the range of from 60 keV to 100 keV. In the third doping step, a pair of n-type high-concentration impurity regions 627 and a pair of n-type high-concentration impurity regions 628 are formed in the island-like semiconductor films 604 and 606, respectively. In addition, a low-concentration impurity region 661 is formed in each of the pair of low-concentration impurity regions 616 where the impurity element imparting n-type conductivity is not doped at high concentration by being covered with the sidewalls 622. Further, a low-concentration impurity region 662 is formed in each of the pair of low-concentration impurity regions 617 where the impurity element imparting n-type conductivity is not doped at high concentration by being covered with the sidewalls 624.

Note that when the impurity element imparting n-type conductivity is not doped in the step shown in FIG. 10D (the first doping step), the regions under the sidewalls 622 and 624 in the island-like semiconductor films 604 and 606 become off-set regions. In order to control the widths of the low-concentration impurity regions 661 and 662 or the off-set regions, the size of the sidewalls 622 and 624 may be adjusted by changing, as appropriate, the thickness of the insulating film 620 or the condition at the etch back method in forming the sidewalls 622 and 624.

Through a series of steps described above, an n-channel TFT 629, a p-channel TFT 630, and an n-channel TFT 631 are formed. In the above-described manufacturing process, the condition of the etch back method or the thickness of the insulating film 620 is changed as appropriate and the size of the sidewalls 622 to 624 is adjusted, so that a TFT having a channel length of 0.2 μm to 2 μm can be formed. Note that in this embodiment mode, a top-gate structure is employed for the TFTs 629 to 631; however, a bottom-gate structure (an inversely-staggered structure) may be employed therefor.

Note that in this embodiment mode, a TFT which is electrically isolated is shown as an example of a semiconductor element; however, a semiconductor element which is used for an integrated circuit is not limited thereto and a variety of circuit elements can be used therefor.

Figure 11D:
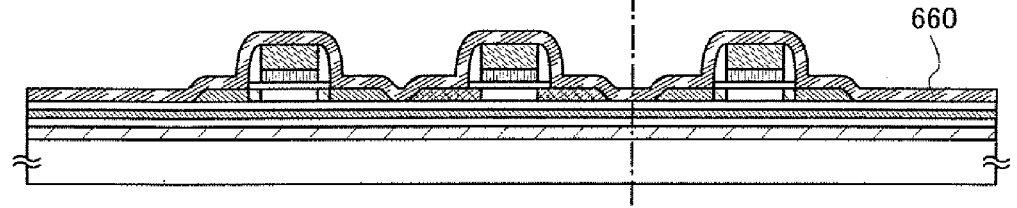

Next, after the resist 625 is removed by ashing or the like, an interlayer insulating film 660 is formed (see FIG. 11D). The interlayer insulating film 660 is formed of a single layer or a stacked layer of an insulating film containing fluorine with the same material as the interlayer insulating film 514.

After the interlayer insulating film 660 is formed, heating at a temperature of greater than or equal to 550° C., specifically heating at 559° C. for 4 hours is performed thereon. When a glass substrate is used as the substrate 600, heating is performed thereon at a temperature of greater than or equal to 550° C. and less than or equal to a glass strain point. Through the heating step, fluorine contained in the interlayer insulating film 660 terminates dangling bonds in the island-like semiconductor films 604 to 606, and at the same time, the added impurity element imparting one conductivity type is activated, and the crystallinity of the high-concentration impurity regions 627, 619, and 628, to which the impurity elements are added, is recovered. In other words, the step of terminating the dangling bonds and the step of activating the impurity element can be performed simultaneously.

In addition, the high-concentration impurity regions 627, 619, and 628 are made amorphous because of addition of the impurity elements; therefore, fluorine atoms easily diffuse into the high-concentration impurity regions 627, 619, and 628 from the interlayer insulating film 660. Consequently, the dangling bonds in the channel forming regions 664 to 666 can be terminated more effectively.

Annealing for terminating the dangling bonds in the island-like semiconductor films 604 to 606 is performed at a higher temperature than the conventional case, so that a TFT does not deteriorate easily with respect to stress; thus, stabilization of the TFTs 629 to 631 can be achieved.

Next, an interlayer insulating film 633 is formed so as to cover the TFTs 629 to 631 and the interlayer insulating film 660. The interlayer insulating film 633 can be formed of a heat-resistant organic resin such as polyimide, acrylic, or polyamide. Instead of the above-described organic resins, a low dielectric constant material (low-k material), a resin including a Si—O—Si bond (hereinafter also referred to as a siloxane-based resin), or the like can also be used. Siloxane has a skeleton structure of a bond of silicon (Si) and oxygen (O). As a substituent, an organic group containing at least hydrogen (such as an alkyl group or aromatic hydrocarbon (an aryl group)) is used. Alternatively, a fluoro group may be used as the substituent. Further alternatively, a fluoro group and an organic group containing at least hydrogen may be used as the substituent. The interlayer insulating film 633 can be formed by spin coating, dipping, spray coating, a droplet discharging method (an ink-jet method, screen printing, offset printing, or the like), a doctor knife, a roll coater, a curtain coater, a knife coater, or the like, depending on the material thereof. Alternatively, the interlayer insulating film 633 can be formed using an inorganic material such as silicon oxide, silicon nitride, silicon oxide containing nitrogen, silicon nitride containing oxygen, PSG (phosphosilicate glass), PBSG (phosphoborosilicate glass), BPSG (borophosphosilicate glass), or an alumina film. Note that such insulating films may be stacked to form the interlayer insulating film 633.

Further, an interlayer insulating film 634 is formed over the interlayer insulating film 633 in this embodiment mode. As the interlayer insulating film 634, a film containing carbon such as diamond-like carbon (DLC) or carbon nitride (CN), a silicon oxide film, a silicon nitride film, a silicon nitride film containing oxygen, or the like formed by a plasma CVD method, atmospheric pressure plasma, or the like can be used.

Alternatively, a photosensitive or non-photosensitive organic material such as polyimide, acrylic, polyamide, a resist, or benzocyclobutene; a resin using siloxane; or the like may be used.

Filler may be mixed into the interlayer insulating film 633 or the interlayer insulating film 634 in order to prevent the interlayer insulating film 633 or the interlayer insulating film 634 from being separated or cracked due to stress generated by a difference in coefficient of thermal expansion between the interlayer insulating film 633 or the interlayer insulating film 634 and a conductive material of a wiring which is formed later, or the like.

Figure 11E:
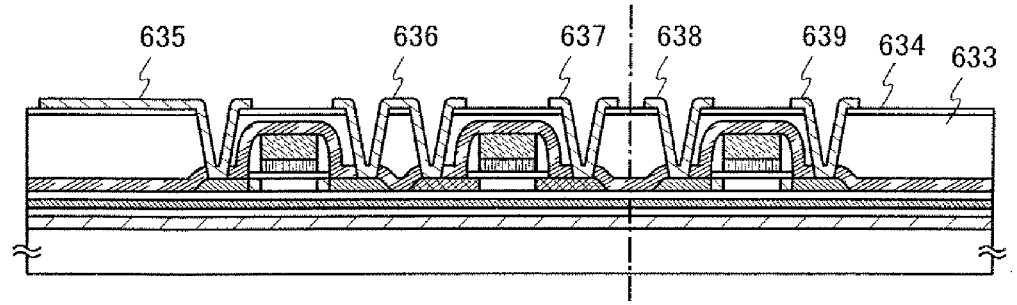

Next, contact holes are formed in the interlayer insulating films 660, 633, and 634, and wirings 635 to 639 which are connected to the TFTs 629 to 631 are formed (see FIG. 11E). Although a mixed gas of $CHF_3$ and He is used for etching in forming the contact holes, the gas is not limited thereto. In this embodiment mode, the wirings 635 to 639 are formed of aluminum. Alternatively, a five-layer structure of titanium (Ti), titanium nitride, aluminum containing silicon (Al—Si), titanium (Ti), and titanium nitride may be employed for the wirings 635 to 639, which may be formed by a sputtering method.

By mixing silicon (Si) into aluminum (Al), it is possible to prevent generation of hillock at the time of baking the resist in forming the wirings. Instead of silicon (Si), copper (Cu) may be mixed in aluminum at a rate of approximately 0.5%. When an aluminum layer containing silicon (Al—Si) layer is sandwiched between titanium (Ti) or titanium nitride, the resistance against the hillock is further improved. Note that it is preferable to use, in etching, the hard mask described above which is made of silicon oxide containing nitrogen or the like. The material and the forming method of the wirings are not limited thereto, and the above-described material used for the gate electrodes may be used.

The wirings 635 and 636 are connected to the high-concentration impurity regions 627 of the n-channel TFT 629. The wirings 636 and 637 are connected to the high-concentration impurity regions 619 of the p-channel TFT 630. The wirings 638 and 639 are connected to the high-concentration impurity regions 628 of the n-channel TFT 631.

Figure 12A:
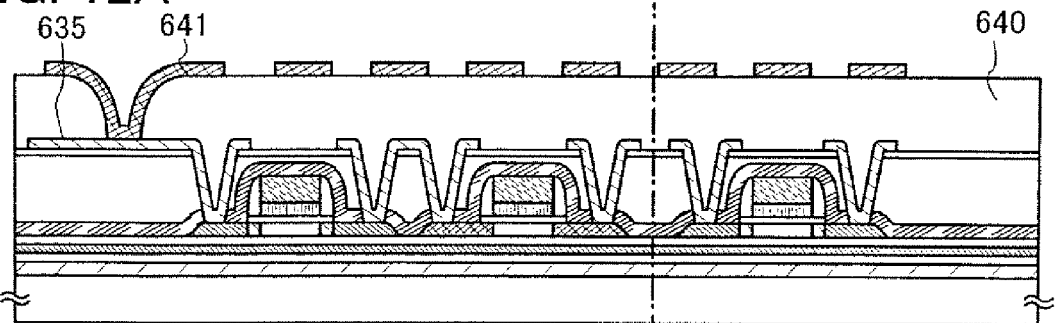
FIGS. 12A to 12D are cross-sectional views showing a manufacturing process of a semiconductor device of the present invention.

Next, as shown in FIG. 12A, an interlayer insulating film 640 is formed over the interlayer insulating film 634 so as to cover the wirings 635 to 639. The interlayer insulating film 640 has an opening at which the wiring 635 is partially exposed. The interlayer insulating film 640 can be formed using an organic resin film, an inorganic insulating film, or a siloxane-based insulating film. As the organic resin film, for example, acrylic, polyimide, polyamide, or the like can be used, and as the inorganic insulating film, silicon oxide, silicon nitride containing oxygen, silicon oxide containing nitrogen, or the like can be used. Note that a mask used to form the opening can be formed by a droplet discharging method or a printing method. The interlayer insulating film 640 itself can also be formed by a droplet discharging method or a printing method.

Next, an antenna 641 is formed over the interlayer insulating film 640. The antenna 641 can be formed of a stacked film of a lower wiring, an antenna base layer, and a copper plating layer. In this case, a nitride film of an alloy of nickel and any of titanium, tantalum, tungsten, or molybdenum is used as the antenna base layer.

Alternatively, the antenna 641 may have a stacked film of a lower wiring, a first base layer, a second base layer, and a copper plating layer. In this case, the first antenna base layer is a nitride film of any of titanium, tantalum, tungsten, or molybdenum, and the second antenna base layer is a nickel nitride film.

The antenna 641 is an internal antenna which is formed inside a semiconductor device capable of wireless communication, and is electrically connected to an external antenna.

After the antenna 641 is formed, a separation insulating film 642 is formed so as to cover the antenna 641. The separation insulating film 642 can be formed using an organic resin film, an inorganic insulating film, a siloxane-based resin film, or the like. The inorganic insulating film is, for example, a DLC film, a carbon nitride film, a silicon oxide film, a silicon nitride film containing oxygen, a silicon nitride film, an aluminum nitride film, an aluminum oxynitride film, or the like. Moreover, the separation insulating film 642 may be formed of a stacked film of polystyrene, a stacked film of a carbon nitride film and silicon nitride film, or the like. In this embodiment mode, the separation insulating film 642 is a silicon nitride film.

Figure 12B:
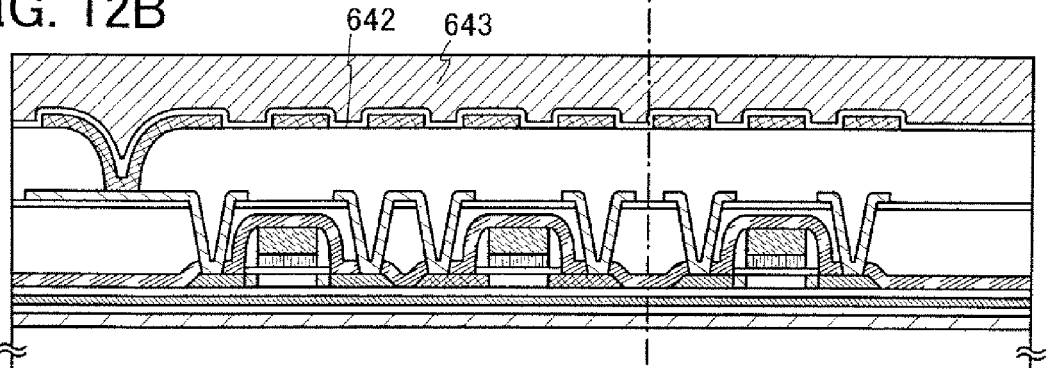

Next, a protective layer 643 is formed so as to cover the separation insulating film 642, as shown in FIG. 12B. The protective layer 643 is formed of a material which can protect the TFTs 629 to 631 and the wirings 635 to 639 when the separation layer 601 is later removed by etching. For example, the protective layer 643 can be formed by applying over the entire surface, an epoxy-based resin, an acrylate-based resin, or a silicon-based resin which is soluble in water or in alcohols.

In this embodiment mode, the protective layer 643 is formed in the following manner: a water-soluble resin (manufactured by Toagosei Co., Ltd.: VL-WSHL10) is applied so as to have a thickness of 30 μm by a spin coating method, and exposed to light for 2 minutes for temporary curing, and then, its rear surface is exposed to UV light for 2.5 minutes and its front surface is exposed to UV light for 10 minutes, 12.5 minutes in total, so that the resin is fully cured. Note that in the case where a plurality of organic resins are stacked, the stacked organic resins might be partly melted depending on a solvent to be used, during application or baking, or the adhesiveness might become too high. Therefore, in the case where organic resins that are soluble in the same solvent are used for the separation insulating film 642 and the protective layer 643, it is preferable to form an inorganic insulating film (e.g., a silicon nitride film, a silicon nitride film containing oxygen, an aluminum nitride film, or an aluminum oxynitride film) so as to cover the separation insulating film 642 in order that the protective layer 643 may be smoothly removed in a later step.

Figure 12C:
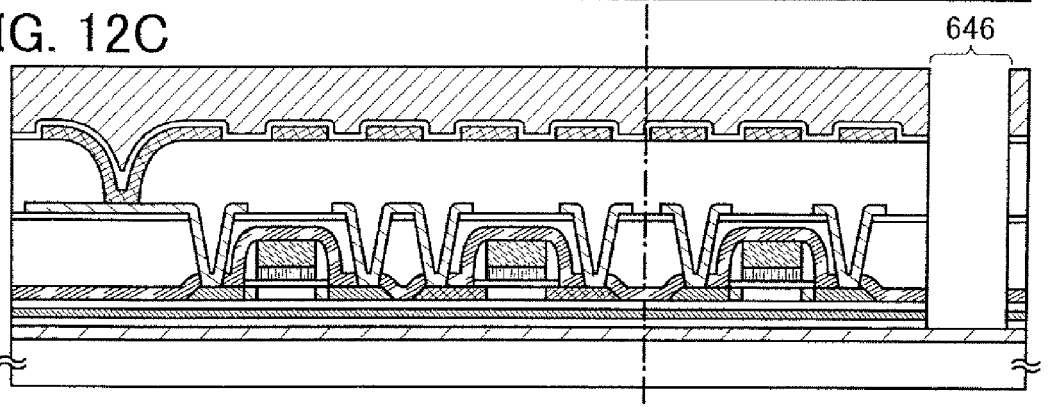

Next, a groove 646 is formed to isolate ID chips from each other, as shown in FIG. 12C. The groove 646 may have such depth that the separation layer 601 is exposed. The groove 646 can be formed by dicing, scribing, a photolithography method, or the like. Note that when the ID chips formed over the first substrate 600 do not need to be isolated from each other, the groove 646 is not necessarily formed.

Figure 12D:
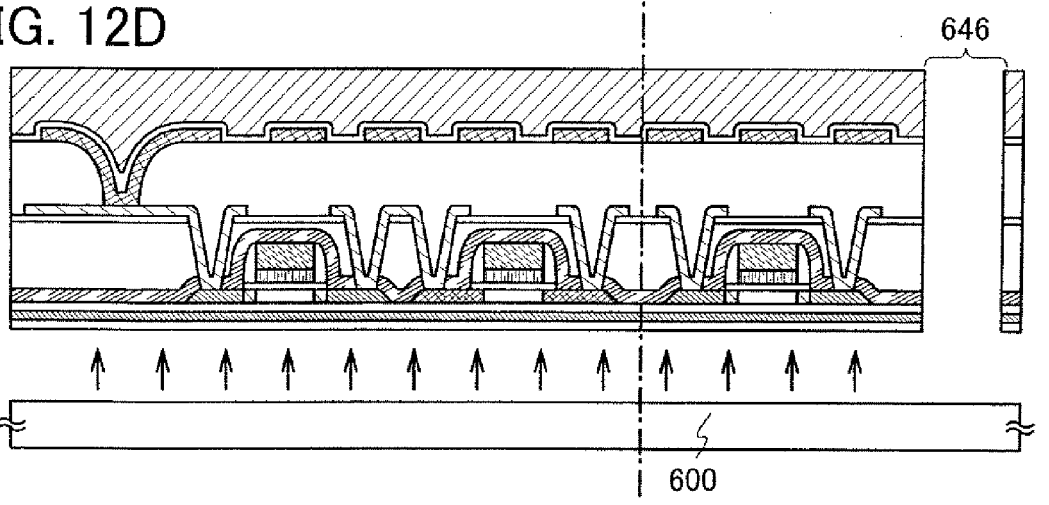

Next, the separation layer 601 is removed by etching, as shown in FIG. 12D. In this embodiment mode, halogen fluoride is used as an etching gas, and the gas is introduced through the groove 646. In this embodiment mode, for example, etching is performed by using $ClF_3$ (chlorine trifluoride) at 350° C. at a flow rate of 300 sccm with an atmospheric pressure of $8 \times 10^2$ Pa (6 Torr) for 3 hours. Alternatively, a gas in which nitrogen is mixed into a $ClF_3$ gas may be used. When halogen fluoride such as $ClF_3$ is used) the separation layer 601 is etched as selected, so that the first substrate 600 can be separated from the TFTs 629 to 631. Further, the halogen fluoride may be either a gas or a liquid.

Subsequently, the TFTs 629 to 631 which have been separated are attached to a second substrate 648 with the use of an adhesive 647. A material which can attach the second substrate 648 and the base film 602 to each other is used for the adhesive 647. As the adhesive 647, for example, various curable adhesives such as a reactive curable adhesive, a thermosetting adhesive, and a light-curable adhesive such as an ultraviolet curable adhesive, and an anaerobic adhesive can be used.

The second substrate 648 may be formed using a flexible organic material such as paper or plastic or a flexible inorganic material. ARTON (manufactured by JSR Corporation) formed of polynorbornene having a polar group can be used for a plastic substrate. In addition, polyester typified by polyethylene terephthalate (PET); polyether sulfone (PES); polyethylene naphthalate (PEN); polycarbonate (PC); nylon; polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; and the like can be given. It is preferable that the second substrate 648 have thermal conductivity as high as approximately 2 W/mK to 30 W/mK in order to diffuse heat generated in an integrated circuit.

The external antenna is formed over the second substrate 648 so as to be connected at least to one of the TFTs 629 to 631 or the internal antenna 641. The external antenna is formed by an ink-jet method. The antenna is drawn in such a manner that a titanium paste containing a titanium fine particle, a nickel paste containing nickel and a copper paste containing copper are mixed at desired rates and the mixture is discharged from a nozzle of an ink-jet apparatus. After the antenna is drawn, heat treatment is performed in a reducing atmosphere to form a titanium-nickel-copper alloy. Heat treatment is further performed so that the obtained titanium-nickel-copper alloy has crystallinity. Thus, the titanium-nickel-copper alloy is crystallized. In this embodiment mode, an austenite layer is formed in the titanium-nickel-copper alloy by heat treatment for crystallization.

Figure 13A:
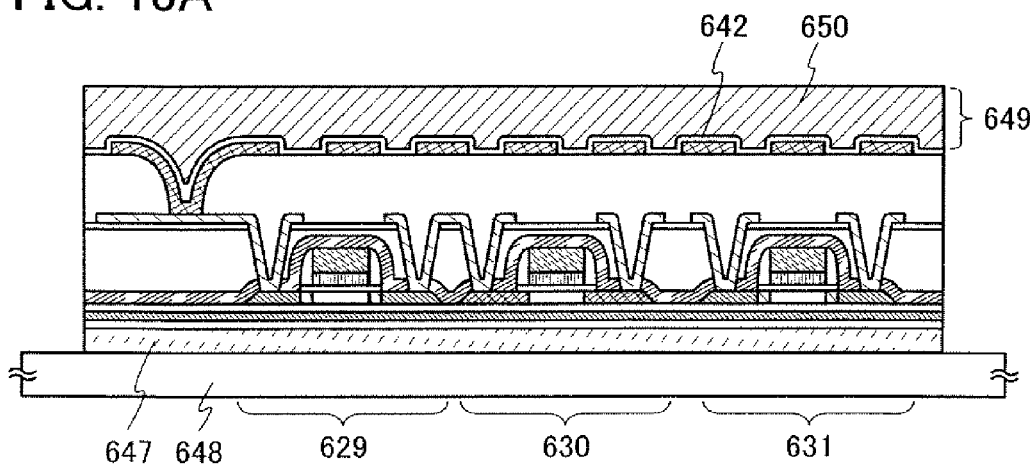
FIGS. 13A and 13B are cross-sectional views showing a manufacturing process of a semiconductor device of the present invention.

Next, an insulating layer 649 is formed so as to cover the separation insulating film 642, as shown in FIG. 13A. The insulating layer 649 can be formed of an organic resin such as polyimide, epoxy, acrylic, or polyamide. Instead of the above-described organic resins, an inorganic resin such as a siloxane-based material can be used. As a substituent of a siloxane-based material, an organic group containing at least hydrogen (such as an alkyl group or aromatic hydrocarbon) is used. Alternatively, a fluoro group may be used as the substituent. Further alternatively, a fluoro group and an organic group containing at least hydrogen may be used as the substituent.

Figure 13B:
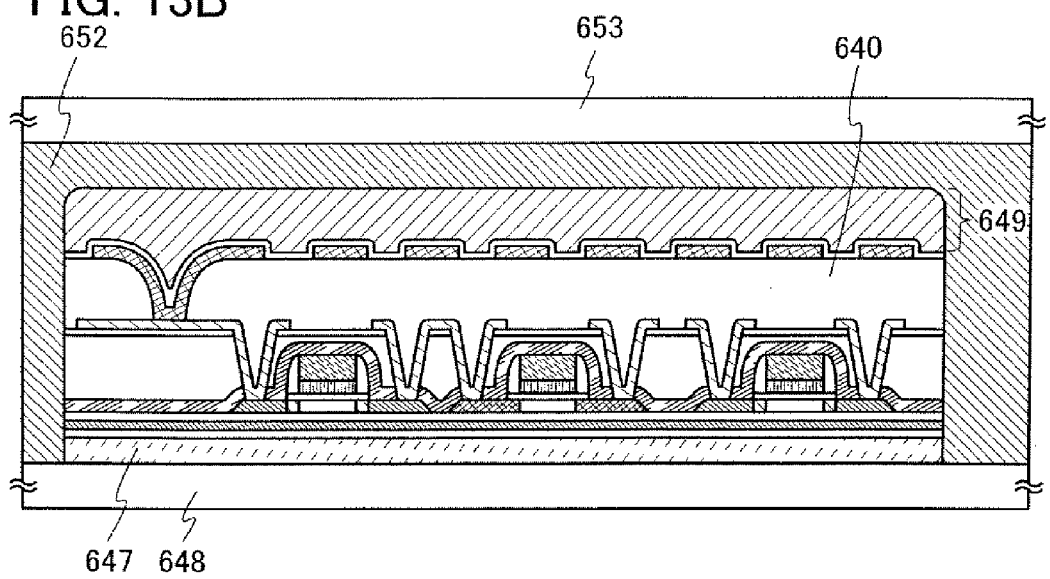

Next, an adhesive 652 is applied onto the insulating layer 649, and a third substrate 653 is attached thereto (see FIG. 13B). The third substrate 653 can be formed of a material similar to that of the second substrate 648. The adhesive 652 may have a thickness of, for example, 10 μm to 200 μm.

A material which can attach the third substrate 653 and the insulating layer 649 to each other is used for the adhesive 652. As the adhesive 652, for example, various curable adhesives such as a reactive curable adhesive, a thermosetting adhesive, and a light-curable adhesive such as an ultraviolet curable adhesive, and an anaerobic adhesive can be used.

Although the third substrate 653 is attached to the insulating layer 649 with the adhesive 652 in this embodiment mode, the present invention is not limited to this structure. The insulating layer 649 and the third substrate 653 can also be attached to each other directly when a resin which functions as an adhesive is used for an insulator 650 of the insulating layer 649.

Note that in this embodiment mode, a semiconductor device capable of wireless communication is manufactured by separation after the insulating film 660, the TFTs 629 to 631, and the like are formed; however, a semiconductor device capable of wireless communication may be manufactured based on one of or both Embodiment Modes 1 and 2, without a separation step.

Figure 14:
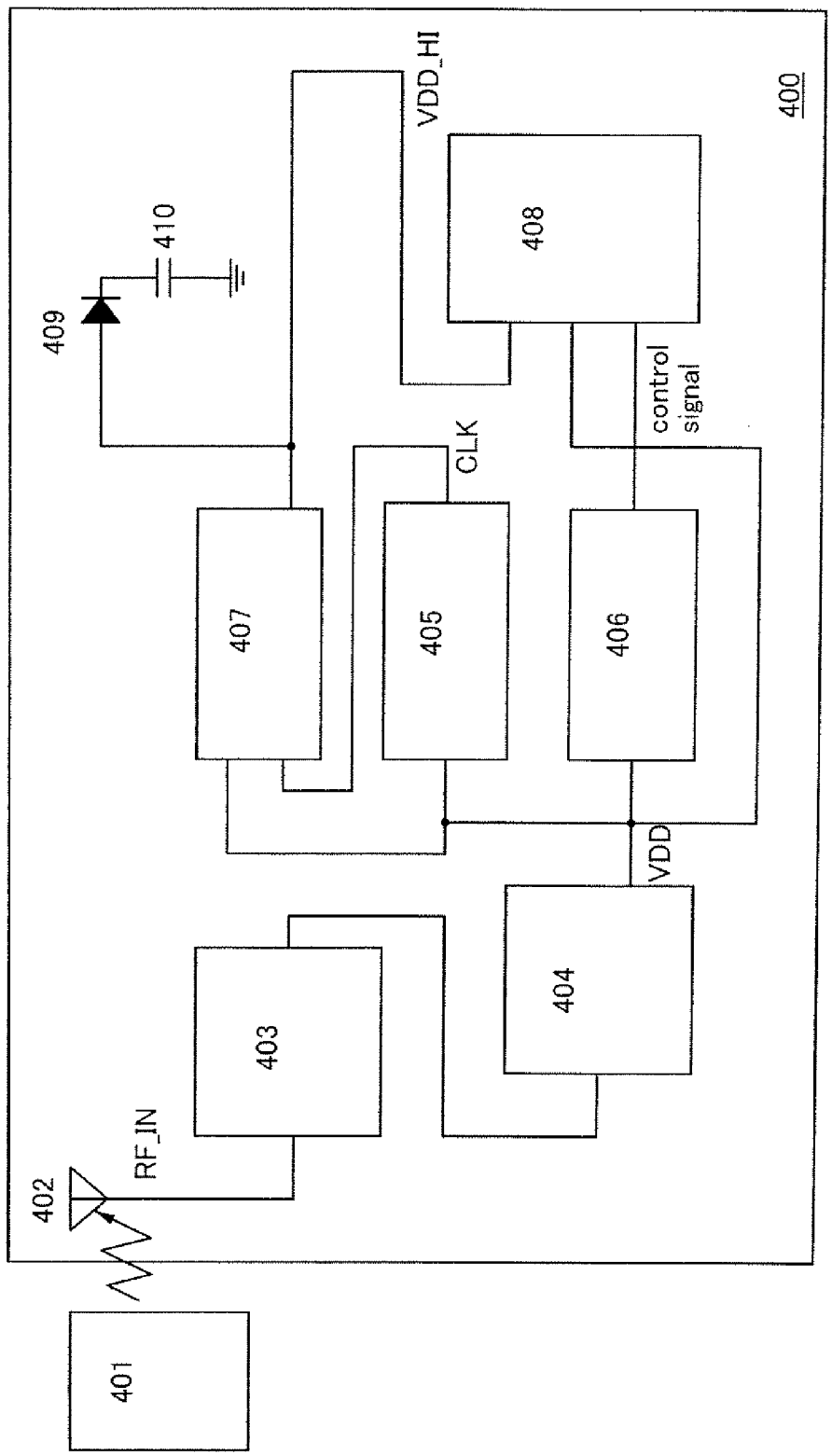
FIG. 14 is a block diagram of a semiconductor device of the present invention.

FIG. 14 is a diagram which shows an example of a block diagram of a circuit layout of the semiconductor device capable of wireless communication of this embodiment mode.

In FIG. 14, a reader/writer 401 is a device for writing and reading data in and from a semiconductor device 400 capable of wireless communication from outside without contact. The semiconductor device 400 capable of wireless communication includes an antenna portion 402 for receiving electric waves; a rectifier circuit 403 for rectifying the output of the antenna portion 402; a regulator circuit 404 for receiving the output of the rectifier circuit 403 and outputting an operating voltage VDD to each circuit; a clock generation circuit 405 for receiving the output of the regulator circuit 404 and generating a clock; a booster circuit 407 for supplying data-writing voltage to a memory circuit 408 that carries out data writing or reading by the receipt of the output of a logic circuit 406; a backflow prevention diode 409 to which the output of the booster circuit 407 is inputted; a battery capacitor 410 to which the output of the backflow prevention diode 409 is inputted to accumulate charges; and the logic circuit 406 for controlling a circuit such as the memory circuit 408. Note that the antenna portion 402 includes the internal antenna 641 and the external antenna which is electrically connected to the internal antenna 641.

Although not particularly shown in the figure, there may additionally be a data modulation/demodulation circuit, a sensor, an interface circuit, and the like. With such a structure, the semiconductor device 400 capable of wireless communication can communicate information with the reader/writer 401 without contact.

In the above structure of the semiconductor device 400 capable of wireless communication, the portion other than the antenna portion 402 can be the integrated circuit, and the antenna and the integrated circuit can be formed over one substrate.

Although this embodiment mode describes the example of the semiconductor device capable of wireless communication provided with the battery capacitor 410 as a wirelessly chargeable battery (radio frequency battery, or non-contact battery by radio frequency), the battery capacitor 410 is not necessarily provided. In that case, the backflow prevention diode 409 is also unnecessary.

Moreover, the capacitor is used as a charging element for accumulating charges (also referred to as a battery); however, the present invention is not limited thereto. In this embodiment mode, the battery refers to a wirelessly chargeable battery of which continuous operation time can be recovered by being charged. Further, as the battery, a thin sheet-like battery or a roll-like battery with a small diameter is preferably used, although the type of battery used may differ depending on the intended use. For example, size reduction is possible with a lithium battery, preferably a lithium polymer battery using gel electrolyte, a lithium ion battery, or the like. Needless to say, the battery may be any kind as long as it is chargeable, and a battery which is chargeable and dischargeable such as a nickel metal hydride battery, a nickel cadmium battery, an organic radical battery, a lead-acid battery, an air secondary battery, a nickel-zinc battery, or a silver-zinc battery, a capacitor with high capacity, or the like may be used as well.

Note that as the capacitor with high capacity which can be used as the battery of this embodiment mode, it is preferable to use a capacitor having electrodes whose opposed areas are large. In particular, it is preferable to use a double-layer electrolytic capacitor which is formed using an electrode material having a large specific surface area, such as activated carbon, fullerene, or a carbon nanotube. A capacitor has a simpler structure than a battery, and further a capacitor can be easily formed to be thin and formed with stacked layers. A double-layer electrolytic capacitor is preferable because it has a function of storing power, does not deteriorate much even after it is charged and discharged a number of times, and is excellent in rapid charging property.

In this embodiment mode, the antenna portion, the rectifier circuit portion, and the booster circuit used in the semiconductor device capable of wireless communication are also used as the antenna portion, the rectifier circuit portion, and the booster circuit portion in the wirelessly chargeable battery; therefore, the reader/writer 401 can be used for a signal generating source for charging the battery capacitor 410 at the same time as operating the semiconductor device capable of wireless communication.

The wirelessly chargeable battery shown in this embodiment mode has features such as capability of charging an object without contact, excellence in portability, and the like. When the battery is provided in the semiconductor device capable of wireless communication, a memory which needs a power source, such as SRAM, can be mounted, which can contribute to sophistication of the semiconductor device capable of wireless communication.

However, the present invention is not limited to this structure, and part or all of the antenna portion, the rectifier circuit portion, and the booster circuit may be separated for RFID operation and for charge of the wirelessly chargeable battery. For example, when the antenna portion 402 is separated for the antenna portion for REID operation and the antenna portion for charge of the wirelessly chargeable battery, the frequency of signals used for RFID operation and the frequency of signals for charge of the wirelessly chargeable battery can be made different from each other. In this case, the signals generated from the reader/writer 401 and the signals generated from the signal generating source to the wirelessly chargeable battery are preferably in the frequency range where the both signals do not interfere with each other.

When the antenna portion, the rectifier circuit portion, and the booster circuit are used in common for RFID operation and for charge of the wirelessly chargeable battery, the following structure may be employed: a switching element is disposed between the wirelessly chargeable battery and the booster circuit, and the booster circuit and the wirelessly chargeable battery are disconnected from each other by turning off the switch during writing operation, whereas they are connected to each other by turning on the switch during the time other than the writing operation. In this case, since the battery is not charged during the writing operation, voltage drop during the writing operation can be avoided. The switching element can have a known structure.

Embodiment Mode 4

In this embodiment mode, application examples of a semiconductor device capable of wireless communication of the present invention will be described. The application range of the semiconductor device capable of wireless communication of the present invention is so wide that it can be applied to any product in order that the information of an object such as the history is revealed without contact and utilized in production, management, and the like. For example, a semiconductor device of the present invention may be incorporated in bills, coins, securities, certificates, bearer bonds, containers for packaging, books, recording media, personal belongings, vehicles, foods, clothes, healthcare items, livingware, medicals, electronic devices, and the like. These examples are described with reference to FIGS. 15A to 15H.

Figure 15A:
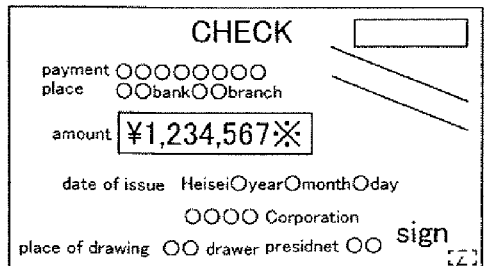
FIGS. 15A to 15H are views each showing an example to which a semiconductor device of the present invention is applied.
Figure 15B:
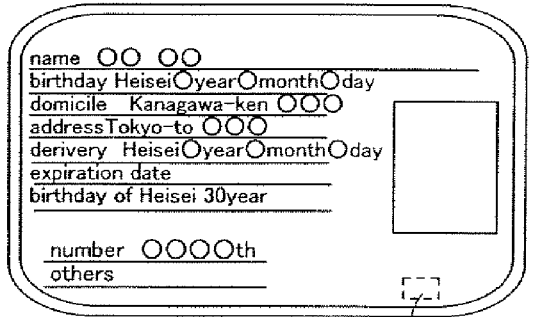
Figure 15C:
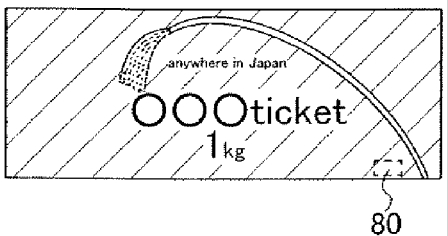
Figure 15D:
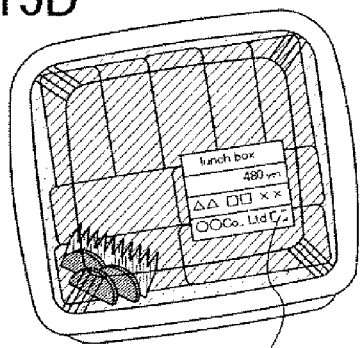
Figure 15E:
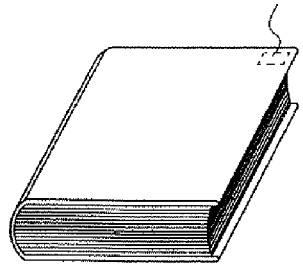
Figure 15F:
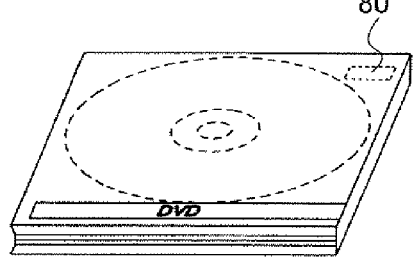
Figure 15G:
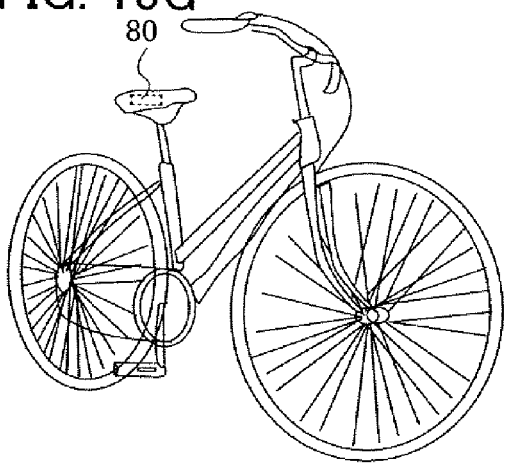
Figure 15H:
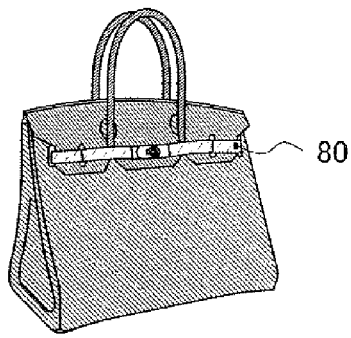

The bills and coins correspond to currency circulating in the market and include ones that are current as money in a specific area (cash voucher), memorial coins, and the like. The securities include checks, stock certificates, promissory notes, and the like (FIG. 15A). The certificates include driver's licenses, resident cards, and the like (FIG. 15B). The bearer bonds include stamps, rice coupons, various gift coupons, and the like (FIG. 15C). The containers for packaging include paper for wrapping a lunch box or the like, plastic bottles, and the like (FIG. 15D). The books include a book, a volume, and the like (FIG. 15E). The recording media include DVD software, video tapes, and the like (FIG. 15F). The vehicles include wheeled vehicles such as bicycles, vessels, and the like (FIG. 15G). The personal belongings include bags, glasses, and the like (FIG. 15H). The foods include food items, beverages, and the like. The clothes include clothing, footwear, and the like. The healthcare items include medical devices, health appliances, and the like. The livingware includes furniture, lighting apparatuses, and the like. The medicals include medicines, agricultural chemicals, and the like. The electronic devices refer to liquid crystal display devices, EL display devices, television devices (TV receivers or thin TV receivers), cellular phones, and the like.

When a semiconductor device 80 capable of wireless communication of the present invention is incorporated in bills, coins, securities, certificates, bearer bonds, or the like, forgery can be prevented. When the semiconductor device 80 capable of wireless communication is incorporated in containers for packaging, books, recording media, personal belongings, foods, livingware, electronic devices, and the like, the efficiency of an inspection system, a rental system, or the like can be achieved. When the semiconductor device 80 capable of wireless communication is incorporated in vehicles, healthcare items, medicals, and the like, forgery and theft of them can be prevented and medicines can be prevented from being taken mistakenly. The semiconductor device 80 capable of wireless communication may be attached to a surface of a product or incorporated into a product. Further, the semiconductor device 80 may be incorporated into paper of a book or an organic resin of a package, for example.

In this manner, the efficiency of an inspection system, a rental system, or the like can be achieved by providing a semiconductor device capable of wireless communication for packaging containers, recording media, personal belongings, foods, clothing, household goods, electronic devices, and the like. Further, forgery or theft can be prevented by providing a semiconductor device capable of wireless communication for the vehicles. In addition, when a semiconductor device is implanted into creatures such as animals, each creature can be identified easily. For example, when a semiconductor device capable of wireless communication, which is provided with a sensor, is implanted into creatures such as domestic animals, not only the year of birth, sex, breed, and the like but also the health condition such as the current body temperature can be easily managed. In particular, by using the semiconductor device shown in the above embodiment mode, it is possible to prevent a defect of the semiconductor device capable of wireless communication due to poor connection between the antenna and the IC chip even when the semiconductor device is provided on a curved surface or the product is bent.

Any of the application examples of a semiconductor device shown in this embodiment mode can be applied to the semiconductor device in any of the other embodiment modes described in this specification.

The present application is based on Japanese Patent Application serial No. 2007-217902 filed with Japan Patent Office on Aug. 24, 2007, the entire contents of which are hereby incorporated by reference.

What is claimed is:

1. A method for manufacturing a semiconductor device comprising the steps of:
   forming a semiconductor film;
   forming a gate insulating film over the semiconductor film;
   forming a gate electrode over the gate insulating film;
   forming an impurity region in the semiconductor film by addition of an impurity element having one conductivity type to the semiconductor film;
   forming an insulating film containing fluorine to cover the semiconductor film, the gate insulating film, and the gate electrode;
   heating the semiconductor film and the insulating film containing fluorine at a temperature of greater than or equal to 550° C. so that the impurity element in the impurity region is activated,
   wherein a side edge of the semiconductor film, the gate insulating film, and the gate electrode are covered with the insulating film containing fluorine in the step of heating the semiconductor film and the insulating film containing fluorine.

2. The method for manufacturing a semiconductor device according to claim 1, wherein the insulating film containing fluorine is any one of a silicon oxide film containing fluorine, a silicon oxide film containing fluorine and nitrogen, or a silicon nitride film containing fluorine.

3. The method for manufacturing a semiconductor device according to of claim 1, wherein the impurity element having one conductivity type is added to the semiconductor film, so that the impurity region in the semiconductor film is made amorphous, and the semiconductor film and the insulating film containing fluorine are heated, so that crystallinity of the impurity region which is made amorphous is recovered.

4. The method for manufacturing a semiconductor device according to claim 1, wherein a dangling bond in the semiconductor film is terminated with fluorine by heating the semiconductor film and the insulating film containing fluorine.

5. The method for manufacturing a semiconductor device according to claim 1, wherein the insulating film containing fluorine contains fluorine at a concentration of greater than or equal to 5 atomic %.

6. The method for manufacturing a semiconductor device according to claim 1, wherein an entirety of the semiconductor film is covered by the insulating film containing fluorine in the step of heating the semiconductor film and the insulating film containing fluorine.

7. A method for manufacturing a semiconductor device comprising the steps of:
   forming a separation layer over a first substrate;
   forming an island-like semiconductor film;
   forming a gate insulating film and a gate electrode over the island-like semiconductor film;

forming an impurity region in the island-like semiconductor film by addition of an impurity element having one conductivity type to the island-like semiconductor film;

forming an insulating film containing fluorine to cover the island-like semiconductor film, the gate insulating film, and the gate electrode;

heating the island-like semiconductor film and the insulating film containing fluorine at a temperature of greater than or equal to 550° C. so that the impurity element in the impurity region is activated;

forming a wiring, which is electrically connected to the impurity region, over the insulating film containing fluorine;

removing the separation layer;

separating the first substrate from the island-like semiconductor film, the gate insulating film, the gate electrode, the insulating film containing fluorine, and the wiring; and attaching the island-like semiconductor film, the gate insulating film, the gate electrode, the insulating film containing fluorine, and the wiring to a second substrate, wherein a side edge of the island-like semiconductor film, the gate insulating film, and the gate electrode are covered with the insulating film containing fluorine in the step of heating the island-like semiconductor film and the insulating film containing fluorine.

8. The method for manufacturing a semiconductor device according to claim 7, wherein the insulating film containing fluorine is any one of a silicon oxide film containing fluorine, a silicon oxide film containing fluorine and nitrogen, or a silicon nitride film containing fluorine.

9. The method for manufacturing a semiconductor device according to claim 7, wherein the impurity element having one conductivity type is added to the island-like semiconductor film, so that the impurity region in the island-like semiconductor film is made amorphous, and the island-like semiconductor film and the insulating film containing fluorine are heated, so that crystallinity of the impurity region which is made amorphous is recovered.

10. The method for manufacturing a semiconductor device according to claim 7, wherein a dangling bond in the island-like semiconductor film is terminated with fluorine by heating the island-like semiconductor film and the insulating film containing fluorine.

11. The method for manufacturing a semiconductor device according to claim 7, wherein the insulating film containing fluorine contains fluorine at a concentration of greater than or equal to 5 atomic %.

12. The method for manufacturing a semiconductor device according to claim 7, wherein an entirety of the island-like semiconductor film is covered by the insulating film containing fluorine in the step of heating the island-like semiconductor film and the insulating film containing fluorine.

13. A method for manufacturing a semiconductor device comprising the steps of:

forming a separation layer in a semiconductor substrate;

bonding a first substrate to the semiconductor substrate;

forming a semiconductor film by separating the semiconductor substrate and the separation layer from the first substrate;

forming an island-like semiconductor film from the semiconductor film;

forming a gate insulating film and a gate electrode over the island-like semiconductor film;

forming an impurity region in the island-like semiconductor film by addition of an impurity element having one conductivity type to the island-like semiconductor film;

forming an insulating film containing fluorine to cover the island-like semiconductor film, the gate insulating film, and the gate electrode;

heating the island-like semiconductor film and the insulating film containing fluorine at a temperature of greater than or equal to 550° C. so that the impurity element in the impurity region is activated, wherein a side edge of the island-like semiconductor film, the gate insulating film, and the gate electrode are covered with the insulating film containing fluorine in the step of heating the island-like semiconductor film and the insulating film containing fluorine.

14. The method for manufacturing a semiconductor device according to claim 13, wherein the insulating film containing fluorine is any one of a silicon oxide film containing fluorine, a silicon oxide film containing fluorine and nitrogen, or a silicon nitride film containing fluorine.

15. The method for manufacturing a semiconductor device according to claim 13, wherein a dangling bond in the island-like semiconductor film is terminated with fluorine by heating the island-like semiconductor film and the insulating film containing fluorine.

16. The method for manufacturing a semiconductor device according to claim 13, wherein the insulating film containing fluorine contains fluorine at a concentration of greater than or equal to 5 atomic %.

17. The method for manufacturing a semiconductor device according to claim 13, wherein an entirety of the island-like semiconductor film is covered by the insulating film containing fluorine in the step of heating the island-like semiconductor film and the insulating film containing fluorine.

* * * * *